US011187836B2

(12) United States Patent
Young et al.

(10) Patent No.: US 11,187,836 B2
(45) Date of Patent: Nov. 30, 2021

(54) METHOD OF BUILDING A 3D FUNCTIONAL OPTICAL MATERIAL LAYER STACKING STRUCTURE

(71) Applicant: Applied Materials, Inc., Santa Clara, CA (US)

(72) Inventors: Michael Yu-tak Young, Cupertino, CA (US); Ludovic Godet, Sunnyvale, CA (US); Robert Jan Visser, Menlo Park, CA (US); Naamah Argaman, San Jose, CA (US); Christopher Dennis Bencher, Cupertino, CA (US); Wayne McMillan, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 87 days.

(21) Appl. No.: 16/293,354

(22) Filed: Mar. 5, 2019

(65) Prior Publication Data
US 2019/0278005 A1  Sep. 12, 2019

Related U.S. Application Data

(60) Provisional application No. 62/639,475, filed on Mar. 6, 2018.

(51) Int. Cl.
  *G02B 26/08* (2006.01)
  *G02B 5/18* (2006.01)
  (Continued)

(52) U.S. Cl.
  CPC ....... *G02B 5/1857* (2013.01); *G02B 26/0808* (2013.01); *G02B 30/26* (2020.01); *G02B 5/1876* (2013.01); *G03F 7/0037* (2013.01)

(58) Field of Classification Search
  CPC .. G02B 26/0808; G02B 30/26; G02B 5/1842; G02B 5/1857; G03F 7/0002;
  (Continued)

(56) References Cited

U.S. PATENT DOCUMENTS 4,985,374 A  1/1991  Tsuji et al.
5,487,962 A  1/1996  Rolfson
(Continued)

FOREIGN PATENT DOCUMENTS

JP  H06342103 A  12/1994
TW  201428938 A  7/2014
(Continued)

OTHER PUBLICATIONS

International Search Report and Written Opinion for PCT/US2019/020813 dated Jun. 19, 2019.
(Continued)

Primary Examiner — Lan Vinh
(74) Attorney, Agent, or Firm — Patterson + Sheridan, LLP

(57) ABSTRACT

Embodiments herein describe a sub-micron 3D diffractive optics element and a method for forming the sub-micron 3D diffractive optics element. In a first embodiment, a method is provided for forming a sub-micron 3D diffractive optics element on a substrate without planarization. The method includes depositing a material stack to be patterned on a substrate, depositing and patterning a thick mask material on a portion of the material stack, etching the material stack down one level, trimming a side portion of the thick mask material, etching the material stack down one more level, repeating trim and etch steps above 'n' times, and stripping the thick mask material from the material stack.

21 Claims, 21 Drawing Sheets

(51) Int. Cl.
*G02B 30/26* (2020.01)
*G03F 7/00* (2006.01)

(58) Field of Classification Search
CPC .... G03F 7/0007; G03F 7/0035; G03F 7/0037; G03H 1/0244; G03H 2001/0292; G03H 2260/63
USPC ...... 216/41, 42, 44, 47, 48, 23, 24; 438/714, 438/717, 719, 723, 736
See application file for complete search history.

(56) References Cited

U.S. PATENT DOCUMENTS

| | | | | |
|---|---|---|---|---|
| 7,978,413 | B2* | 7/2011 | Abe | G02B 3/0012 359/628 |
| 8,709,951 | B2* | 4/2014 | Chun | H01L 21/28123 438/707 |
| 2004/0020892 | A1 | 2/2004 | Matthews et al. | |
| 2004/0028327 | A1 | 2/2004 | Behfar et al. | |
| 2010/0187658 | A1* | 7/2010 | Wei | H01L 21/3088 257/618 |
| 2011/0117744 | A1* | 5/2011 | Ito | H01L 21/76816 438/702 |
| 2015/0062710 | A1 | 3/2015 | Grillmayer et al. | |
| 2015/0174816 | A1* | 6/2015 | Mizuno | B29C 59/002 264/101 |
| 2015/0306812 | A1* | 10/2015 | Gao | B29C 33/38 425/385 |
| 2016/0099187 | A1* | 4/2016 | Lian | H01L 21/0273 438/8 |
| 2016/0111361 | A1 | 4/2016 | Oh et al. | |
| 2017/0263510 | A1* | 9/2017 | Baba | G03F 7/0002 |

FOREIGN PATENT DOCUMENTS

| | | |
|---|---|---|
| TW | 201629619 A | 8/2016 |
| WO | 2016128054 A1 | 8/2016 |

OTHER PUBLICATIONS

Office Action from Taiwan Patent Application No. 108107422 dated Nov. 14, 2019.
Office Action from Taiwan Patent Application No. 108107422 dated Mar. 27, 2020.

* cited by examiner

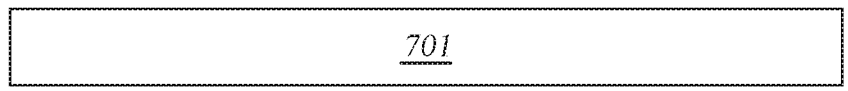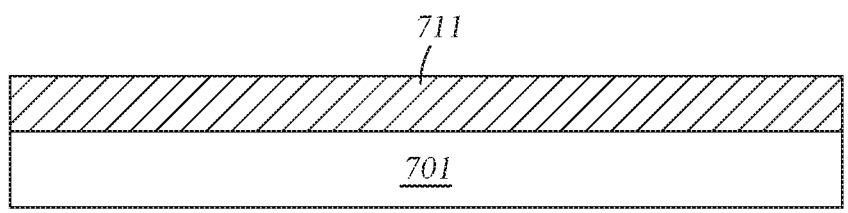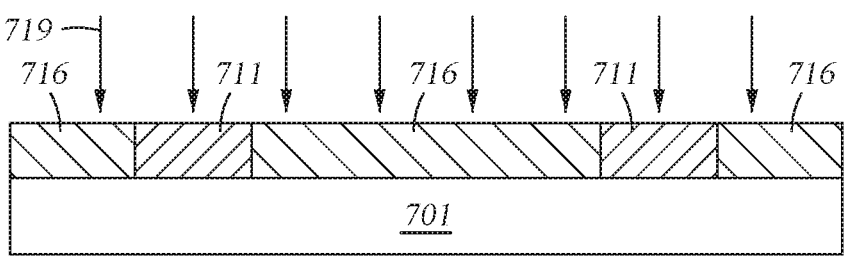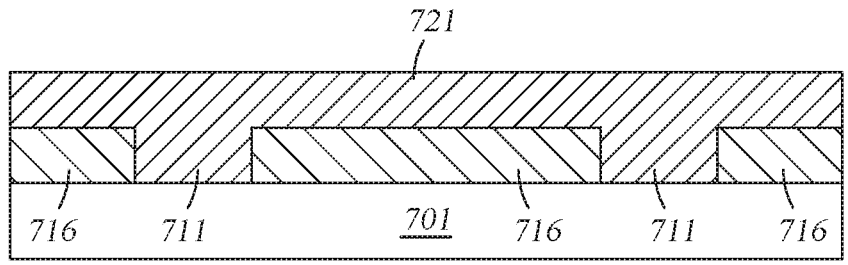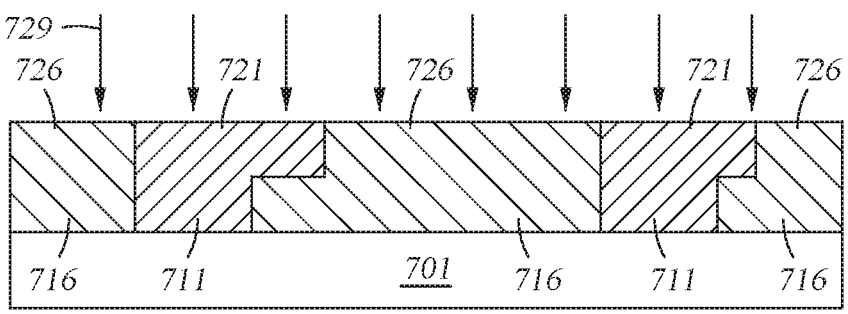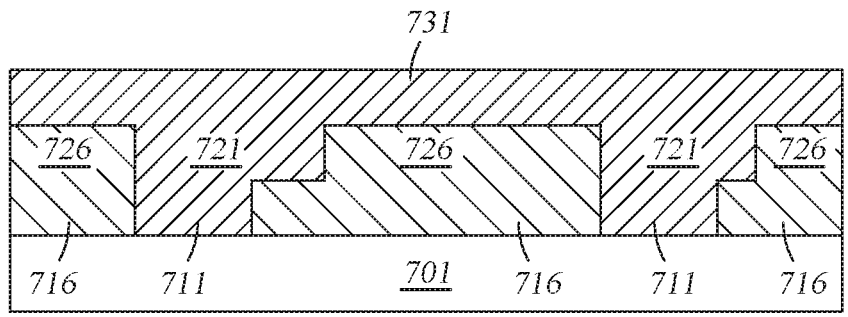

METHOD OF BUILDING A 3D FUNCTIONAL OPTICAL MATERIAL LAYER STACKING STRUCTURE

CROSS-REFERENCE TO RELATED APPLICATIONS

This application claims benefit of U.S. Provisional Application Ser. No. 62/639,475, filed Mar. 6, 2018, of which is incorporated by reference in its entirety.

BACKGROUND OF THE DISCLOSURE

Field of the Invention

The embodiments herein generally relate to a process for forming 3D optical stackable structures.

Description of the Background Art

The 3D optical structures are used to produce complex optical devices. For example, the 3D optical structures may be used to generate 3D holograms with light. However, the quality of the 3D optics is highly dependent on increasing the density, and reducing the size of the 3D patterns on a stackable layer structure used for 3D optics. Creating a conventional 3D optical structure involves the formation of a 3-dimensional (3D) patternable and stackable layer structure with resist over a substrate. The substrate has a first layer of material deposited thereon and a resist is patterned for a first layer. The structure is then filled with a metal prior to planarizing with a chemical mechanical polisher. These operations are repeated over and over again for each layer to produce a plurality of different vertical heights in the structure. However, the current structures still yield structures of greater than a micron scale which results in a resolution that is undesirable for some 3D optical applications such as holograms.

While the problems and benefits of multiple patterning in terms of resolution, depth of focus and lithographic defect sensitivity are understood, there is additional desire to control the process budget and increase and maintain yield. Additionally, it is not easy to create this kind of structure since the application of subsequent material level(s) can dissolve or destroy the previously patterned material.

Therefore, there is a need for an improved method for creating a high density 3D multi-patterned structure on a substrate.

SUMMARY OF THE INVENTION

Embodiments herein describe a sub-micron 3D optical material structure and a method for forming the sub-micron 3D optical material structure. In a first embodiment, a method is provided for forming a sub-micron 3D optical material structure on a substrate without planarization, the method begins by depositing a material stack to be patterned on a substrate; depositing and patterning a thick mask material on a portion of the material stack, etching the material stack down one level; trimming a side portion of the thick mask material; etching the material stack down one more level, repeating trim and etch operations above 'n' times, and stripping the thick mask material from the material stack.

In a second embodiment, a method is provided for forming a sub-micron 3D optical material structure on a substrate without planarization, the method begins by coating a substrate with a first layer of a material, exposing the specified material with a lithography method to produce a first pattern, curing the exposed specified material if needed, coating the substrate with a second layer of the material, exposing the specified material with a lithography method to produce a second pattern, curing the exposed specified material if needed, repeating the operations for coating, exposing and curing above 'n' times for n layers of the material having n patterns exposed therein, and developing the exposed and cured regions of n patterns on n layers simultaneously.

In a third embodiment, a sub-micron asymmetrical 3D optical material structure is provided. The asymmetrical 3D optical material structure has a substrate having a top surface, a first functional material level formed on the top surface of the substrate. The first function material level further has a plurality of first unit pieces of material, each first unit piece of material having a height, a width and a length, all of which are less than about a micron. The asymmetrical 3D optical material structure further has a second functional material level formed on the first top surface of the first functional material level. The second function material level further has a plurality of second unit pieces of material, wherein each second unit piece of material is disposed on one of the first unit pieces and each second unit piece of material having a height, a width and a length, substantially similar to that of the first unit piece of material. The asymmetrical 3D optical material structure further has a third functional material level formed on the second top surface of the second functional material level, wherein the third function material level further has a plurality of third unit piece of material, wherein each third unit piece of material is disposed on one of the second unit piece of material and each third unit piece of material having a third height, a third width and a length, substantially similar to that of the second unit piece of material.

In a fourth embodiment, a sub-micron symmetrical 3D optical material structure is provided. The sub-micron symmetrical 3D optical material structure has a substrate having a top surface, a film stack disposed on the top surface of the substrate having an upper surface, a first functional material level formed on the upper surface of the film stack having a first width and a first upper surface, a second functional material level formed on the first upper surface of the first functional material level having a second width, and a third functional material level formed on the second upper surface of the second functional material level having a third width wherein the first width is greater than the second width which is greater than the third width and the first width, second width and third width form a profile symmetric about a center of the 3D optical material structure.

In a fifth embodiment, a method is provided for fabricating a sub-micron 3D diffractive optics element. The method begins by depositing an optical material stack to be patterned into a diffractive optics element on a substrate. The method then deposits and patterns a mask material on a portion of the material stack. The method continues by etching the material stack down one level. The method then directionally etch one or more side portions of the mask material laterally by a desired distance and etches vertically the material stack down vertically a $2^{nd}$ level. The method finishes by stripping the mask material.

BRIEF DESCRIPTION OF THE DRAWINGS

So that the manner in which the above recited features of the embodiments herein are attained and can be understood in detail, a more particular description of the invention, briefly summarized above, may be had by reference to the embodiments thereof which are illustrated in the appended drawings.

FIGS. 7A through 7J illustrate the fifth method of FIG. 6 for building 3D functional optical material level structure on a substrate using repetitive coating and exposure technique.

Figure 1:
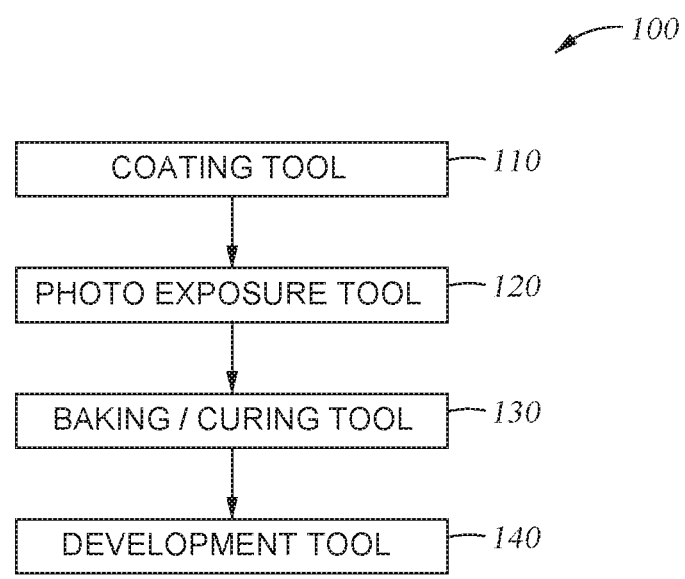
FIG. 1 illustrates a group of semiconductor processing equipment suitable for building a 3D functional optical material stacking structure on a substrate.

To facilitate understanding of the embodiments, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments and are therefore not to be considered limiting of its scope, for the invention may admit to other equally effective embodiments.

DETAILED DESCRIPTION

Diffractive optical elements have been in use since the $19^{th}$ century. In recent years, advancement in optics research enabled light manipulation using sub-wavelength and sub-micron diffractive optics, in both simulation and low volume fabrication. These nano-antennae can change the phase, amplitude, and polarization of light. Meta-surfaces based on Pancharatnam-Berry effect or other posts are one embodiment, made of high-aspect-ratio dielectric pillars. Mie or Huygens resonators, made with nano-discs are another embodiment and plasmonics resonance might be another. However, the feature dimensions required by resonators are challenging to achieve at scale, whether through stringent deposition, patterning, etching or other semiconductor-based methods. Moreover, the efficiency of plasmonics optical elements is limited, so it could only cater to some applications.

Multi-level diffractive optics elements benefit from manipulating the scalar properties of light through features that could be larger than the wavelength. If the features involve dimensions that are over 1 um, they can be fabricated using greyscale lithography, either with direct or indirect writing tools. Yet, greyscale lithography is limited in its resolution and shrinking the x, y and z features could enable higher field-of-view, larger numerical aperture and others.

One approach to fabrication of sub-micron multi-level diffractive optics is taking the multiple patterning, in which every layer is separately deposited, patterned and etched. Another approach takes a metal damascene route for multiple level fabrications. This approach of multiple patterning demonstrates both benefits and challenges in terms of resolution, depth of focus and lithographic defect sensitivity. It is also additional beneficial to control the process budget and increase and maintain yield. This work describes a method for creating a high-density, sub-micron multi-level patterned structure on a substrate.

Functional layer(s) modification makes the previous layer(s) more robust to withstand subsequent layer processing which enables 3D layer stacking optical structures. Embodiments here aim to reduce the material processing interaction when processing multiple patterned layers to form 3D patterned optical structures for engineered optics application. Embodiments are illustrated below to show the fabrication techniques for the 3D layer stacking optical structures. In one embodiment, one or more radiation curable functional leave-on material levels form the 3D patterned structure. In another embodiment, one or more radiation curable functional organic polymer, inorganic, or organic/inorganic hybrid material level form 3D patterned structures. In yet another embodiment, radiation hardening is provided for a previous material level (additional polymer cross linking) to improve the robustness of the previous material and to provide "skin" protection against subsequent material level processing and patterning. In yet another embodiment, a surface treatment process, such as atomic layer deposition (ALD), is used between patterned layers to provide a barrier layer to minimize interaction of subsequent layers with previous layer(s). In yet another embodiment, an impregnation technique (can be dry, wet or vapor treatment) is used to improve the robustness of the previous material level(s). In yet another embodiment, a doping technique, or ion implantation technique, is used to improve the robustness of the previous material level(s). In yet another embodiment, alternating material level pairs (layer of material A and layer of material B) are used to reduce material interaction during processing. For example, material A may be a sol-gel base material and material B can be a polymer based material. In yet another embodiment, sol-gel material levels are used to build up 3D structures such that cured sol-gel layers forming SiO$_x$ are robust enough to withstand material interaction with subsequent sol-gel layer processing. Advantageously, previous patterned layers are protected and are able to endure subsequent layer processing and patterning.

Additional embodiments are directed to the formation of symmetrical 3D optical stacking structures. The symmetrical 3D optical stacking structures utilize a resist trim process to generate sub-micron scale features. Further embodiments take the symmetrical approach and add a hardmask to make the symmetrical feature one sided, such as a Fresnel lens. In yet further embodiments, directional etch is utilized to form completely customizable and/or asymmetrical sub-micron 3D optical structures.

The embodiments briefly discussed above advantageously provide reduced operations for generating the structures while enabling the construction of sub-micron scale 3D optical structures. The methods disclosed below enable highly sophisticated customizable 3D optical structures to be quickly formed in a cost effective manner on a sub-micron scale. For example, the 3D features may be formed at a scale with a height such as between about 20 nm to about 1 micron, such as about 500 nm or 200 nm. The 3D optical structures may be formed on a diffractive optics element structure, i.e., a sheet of material with sub-wavelength thickness with subwavelength-scaled patterns in the horizontal dimensions. The diffractive optics element structure may have gratings and other single level structures, symmetrically stepped structures and stepped structures with one or more sides with no steps.

The structures disclosed herein are completely customizable for forming features which may appear at the Nano scale to display symmetry or asymmetry about a central axis, a step structure, or a portion thereof any possibly 3D feature. It should be appreciated that the scale of said features, although 3D at the Nano scale, may be used to form a flat lens at a scale visible to an unaided human eye. Furthermore, although the figures for the discussion below all illustrate square structures, it should be appreciated that the methods disclosed herein could be used to make elliptical cross-section pillars having different major and minor axis, a circular pillar or any other polygon shape for forming pillars of differing heights in the 3D optical stacking structures.

FIG. 1 illustrates a group of semiconductor processing equipment 100 suitable for building 3D optical material stacking structure on a substrate. The group of semiconductor processing equipment 100 has one of more of a coating tool 110 or spin coating, a photo exposure tool 120, a baking/curing tool 130 and a development tool 140.

The coating tool 110 is configured to apply a layer of material onto a substrate. The coating tool 110 may use a spray coating technique for applying a substantially even layer of material. Alternately, the coating tool 110 may use a spin coating technique for applying a substantially even layer of material. In yet other alternatives, the coating tool 110 may be a chemical vapor deposition chamber or a plasma vapor deposition chamber, an atomic layer deposition chamber, or other suitable device suitable to apply a thin film, such as few micro meters or nanometers, of material to the substrate.

The photo exposure tool 120 may be a lithography tool which provides light energy to alter the resist to form a pattern therein. The photo exposure tool 120 may use a digital mask to form the patterns on the resist for forming features thereon.

The baking/curing tool 130 may use temperature or other energy to change the material composition of an outer surface or entire layer of the material deposited on the substrate. The baking/curing tool 130 may remove moisture, or volatiles, i.e., solvents, or catalyzes a reaction to alter the material for suitability or compatibility of subsequently materials subsequently applied on to the baked, i.e., cured, layer of material.

The development tool 140 dissolves the layers of resist on the substrate to reveal the structure of the pattern created thereon. After development, the substrate contains the 3D optical material stacking structures for creating devices thereon the substrate. The 3D optical material stacking structure may be formed by using one of the several methods discussed below.

FIGS. 2A through 2F illustrate a first method 200 for building 3D functional optical material level structure on a substrate using a surface treatment technique. The embodiment depicts the 3D stacking of optical material levels resulting in pillars of various heights on a substrate 201. The first method 200 provides a reduced number of operations over conventional operations and additionally eliminates repetitive planarizing steps.

Figure 2A:
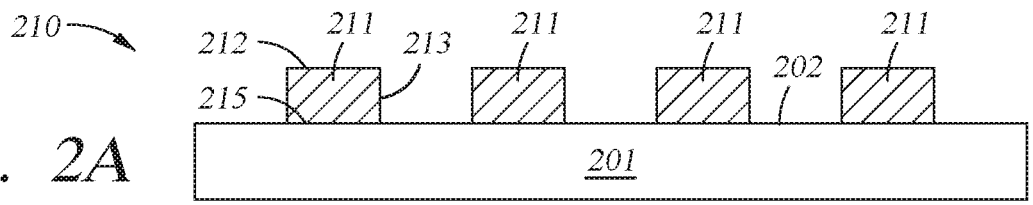
FIGS. 2A through 2F illustrate a first method for building 3D functional optical material level structure on a substrate using a surface treatment technique.

At block 210 shown in FIG. 2A, one or more first functional material levels (FML) 211 are formed on a top surface 202 of the substrate 201. The first FML 211, and each FML further described here, has a thickness, or height, of between about 20 nm to about 1 micron, such as about 200 nm. The first FML 211 has a first outer surface 213, a first top surface 212 and a first bottom surface 215. The first top surface 212 of the first FML 211 is provided opposite the first bottom surface 215. The first bottom surface 215 being disposed on the top surface 202 of the substrate 201.

Figure 2B:
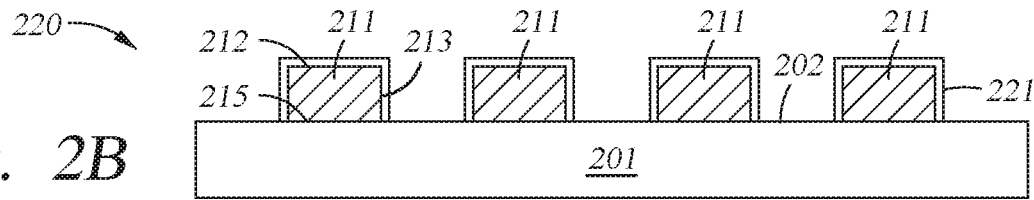

At block 220 shown in FIG. 2B, a first surface treatment (ST) 221 is performed on the first outer surface 213 of the first FML 211. The first ST 221 extends over the first top surface 212 but not the first bottom surface 215. The first ST 221 may be an atomic deposition layer, doped or ion implantation, radiation hardening, radiation curable (such as baking or ultra violet (UV) cured) or other treatment which changes the composition of the first outer surface 213 of the first FML 211.

Figure 2C:
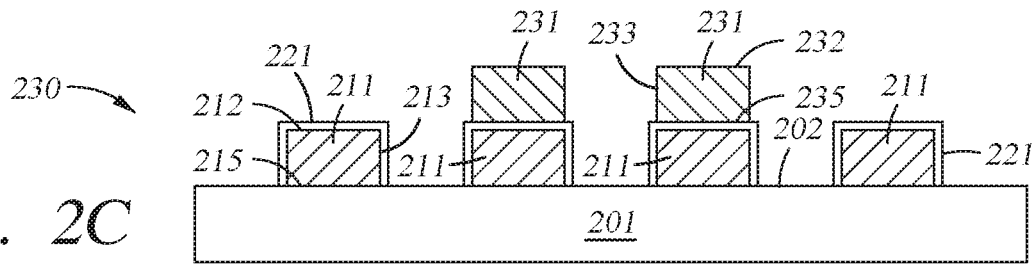

At block 230 shown in FIG. 2C, one or more second functional material levels (FML) 231 are formed on one or more of the first top surface 212 of the first FML 211, wherein the first top surface 212 has the first ST 221. The second FML 231 is compatible with the first ST 221 such that a solvent or other chemical will not attack the underlying previous layer, i.e., the first FML 211. Each second FML 231 is deposited on one, but not necessarily all, of the first FML 211. For example, the second FML 231 would not be formed on the substrate 201. However, it should be appreciated that each first FML 211 may not necessarily have one of the second FML 231 formed thereon, such as the first FML 211 provided with item number 239. The second FML 231 has a second outer surface 233, a second top surface 232 and a second bottom surface 235. The second bottom surface 235 is disposed on the first top surface 212 of the first ST 221.

Figure 2D:
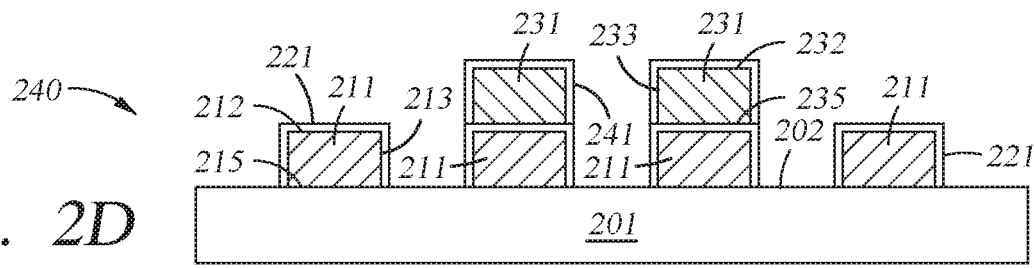

At block 240 shown in FIG. 2D, a second surface treatment (ST) 241 is performed on the second outer surface 233 of the second FML 231. The second ST 241 extends over the second top surface 232 but not the second bottom surface 235. The second ST 241 is substantially similar to first ST 221. Alternately, the first ST 221 and second ST 241 may utilize different techniques to change the composition of the first outer surface 213 and the second outer surface 223.

Figure 2E:
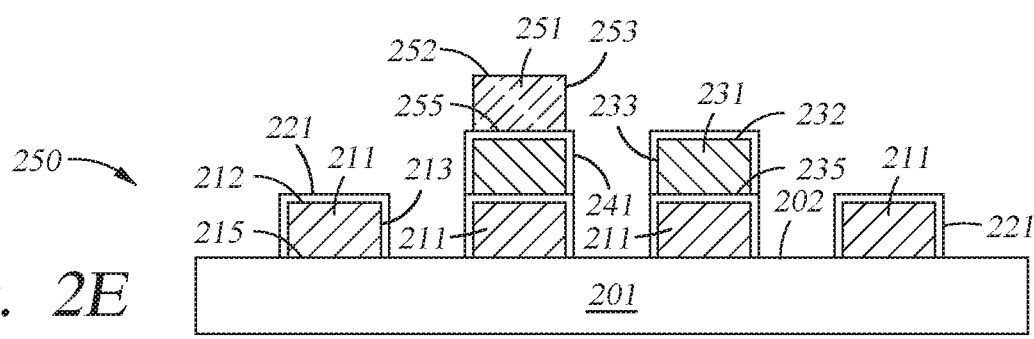

At block 250 shown in FIG. 2E, one or more third functional material levels (FML) 251 are formed on one or more of the second top surface 232 of the second FML 231 wherein the second top surface 232 has the second ST 241. Each third FML 251 is always disposed on one, but not necessarily all, of the second FML 231. For example, the third FML 251 would not be directly formed on either the substrate 201 or the first FML 211. Again, it should be appreciated that each second FML 231 may not necessarily have one of the third FML 251 formed thereon. The third FML 251 has a third outer surface 253, a third top surface 252 and a third bottom surface 255. The third bottom surface 255 is disposed on the second top surface 232 of the second ST 241.

Figure 2F:
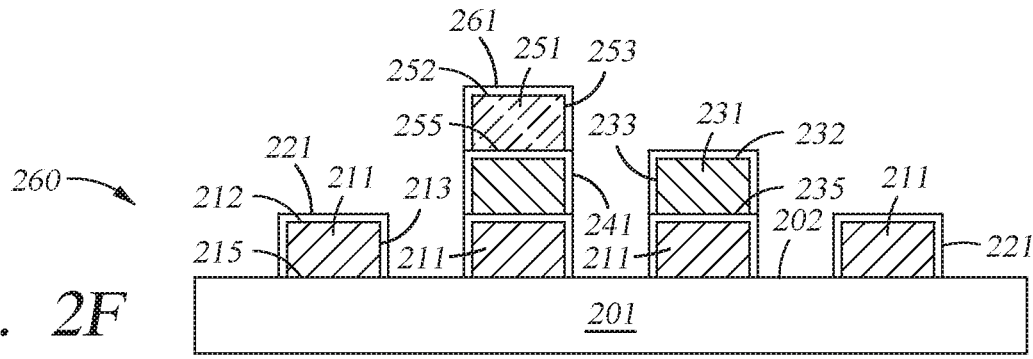

At block 260 shown in FIG. 2F, a third surface treatment (ST) 261 is performed on the third outer surface 253 of the third FML 251. The third ST 261 extends over the third top surface 252 but not the third bottom surface 255. The third ST 261 is substantially similar to the first ST 221 and the second ST 241. Alternately, the third ST 261 may utilize a technique different than either the first ST 221 or the second ST 241.

It should be appreciated that the layers may continue to be stacked well beyond three layers. Each layer merely needs to be chemically compatible with the surface treatment provided at the lower layer. The operations outlines above may be repeated any number of times to produce a complex and highly sophisticated 3D optical structure as illustrated in FIGS. 8A through 8E which will be discussed further below. However, as will be disclosed with respect to the embodiment of a second method 300 disclosed in FIGS. 3A through 3F, the highly sophisticated 3D optical structures may be created by yet another technique.

FIGS. 3A through 3F illustrate the second method 300 for building a 3D functional optical material level structure on a substrate using a material impregnation technique. The embodiment depicts the 3D stacking of optical material levels resulting in pillars of various heights on a substrate 301.

Figure 3A:
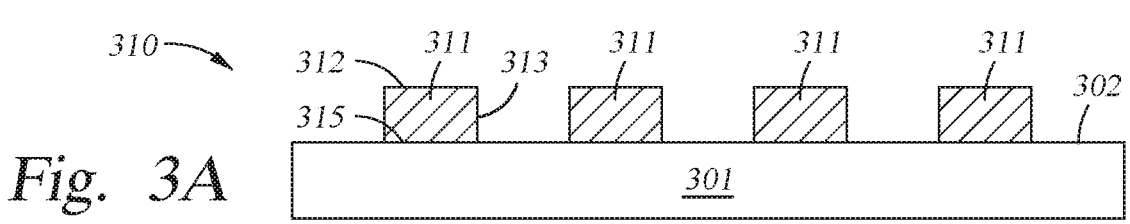
FIGS. 3A through 3F illustrate a second method for building 3D functional optical material level structure on a substrate using a material impregnation technique.

At block 310 shown in FIG. 3A, one or more first functional material levels (FML) 311 are formed on a top surface 302 of the substrate 301. The first FML 311, and each FML further described with respect to FIGS. 3A through 3F, has a thickness, or height, of between about 20 nm to about 1 micron, such as about 200 nm. The first FML 311 has an outer surface 313, a first top surface 312 and a first bottom surface 315. The first top surface 312 of the first FML 311 is provided opposite the first bottom surface 315. The first bottom surface 315 being disposed on the top surface 302 of the substrate 301.

Figure 3B:
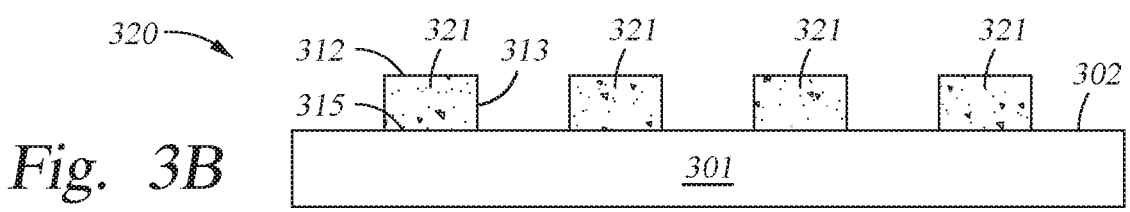

At block 320 shown in FIG. 3B, a treatment is performed on the first FML 311 to form a first treated FML 321. The first treated FML 321 is a changed composition for the material of the first FML 311. For example, the treatment may be performed by baking or electron volt implantation to alter the structure of the first FML 311 to yield the first treated FML 321, a more robust material suitable for stacking and substantially chemically inert to subsequent layers as which may be disposed thereon.

Figure 3C:
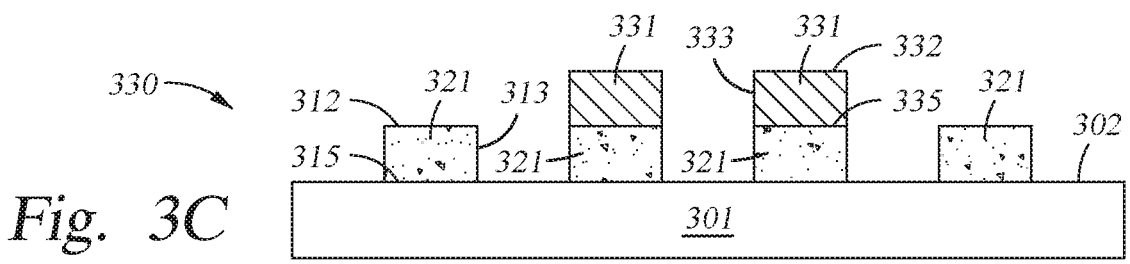

At block 330 shown in FIG. 3C, one or more second functional material levels (FML) 331 are formed on one or more of the first top surface 312 of the first treated FML 321. The second FML 331 is compatible with the first treated FML 321 such that a solvent or other chemical will not attack the underlying layer, i.e., the first treated FML 321. Each second FML 331 is disposed on one, but not necessarily all, of the first treated FML 321. For example, the second FML 331 would not be formed on the substrate 301. However, it should be appreciated that each first treated FML 321 may not necessarily have one of the second FML 331 formed thereon, such as the first treated FML 321 provided with item number 339. The second FML 331 has a second outer surface 333, a second top surface 332 and a second bottom surface 335. The second bottom surface 335 being disposed on the first top surface 312 of the first treated FML 321.

Figure 3D:
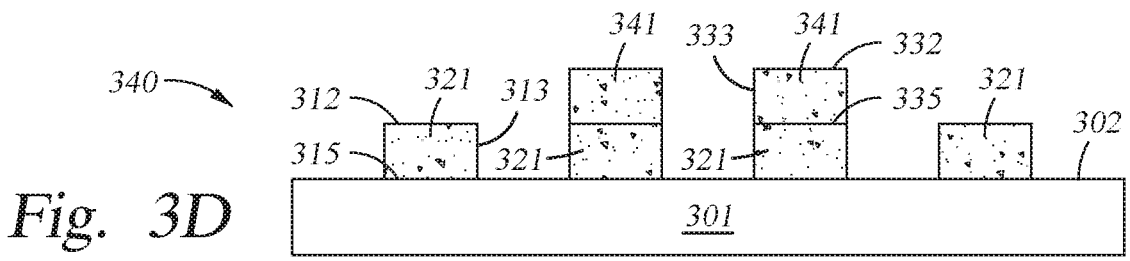

At block 340 shown in FIG. 3D, a treatment is performed on the second FML 331 to form a second treated FML 341. The second treated FML 341 is a changed composition for the material of the second FML 331. For example, the treatment alters the structure of the second FML 331 to yield the second treated FML 341, a more robust material suitable for stacking similar, though not necessarily the same, to the first treated FML 321.

Figure 3E:
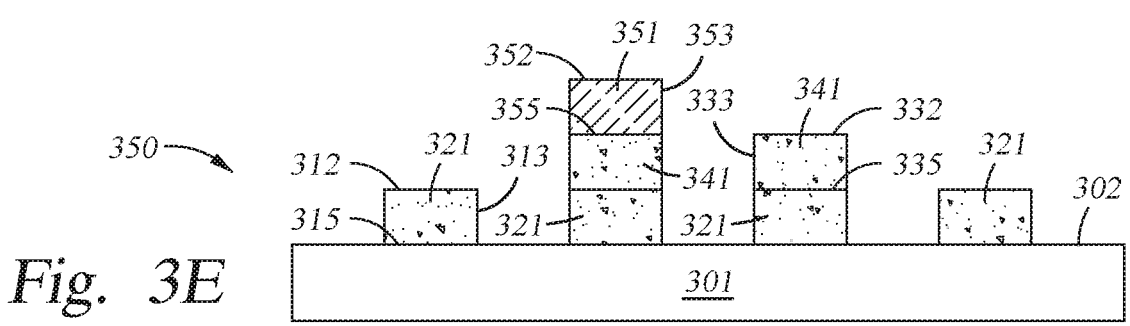

At block 350 shown in FIG. 3E, one or more third functional material levels (FML) 351 are formed on one or more of the second top surface 332 of the second treated FML 341. The third FML 351 is compatible with the second treated FML 341 such that a solvent or other chemical will not attack the previous layer, i.e., the second treated FML 341. Each third FML 351 is disposed on one, but not necessarily all, of the second treated FML 341. For example, the third FML 351 would not be formed on the substrate 301 or even the first treated FML 321. However, it should be appreciated that each second treated FML 341 may not necessarily have one of the third FML 351 formed thereon.

Figure 3F:
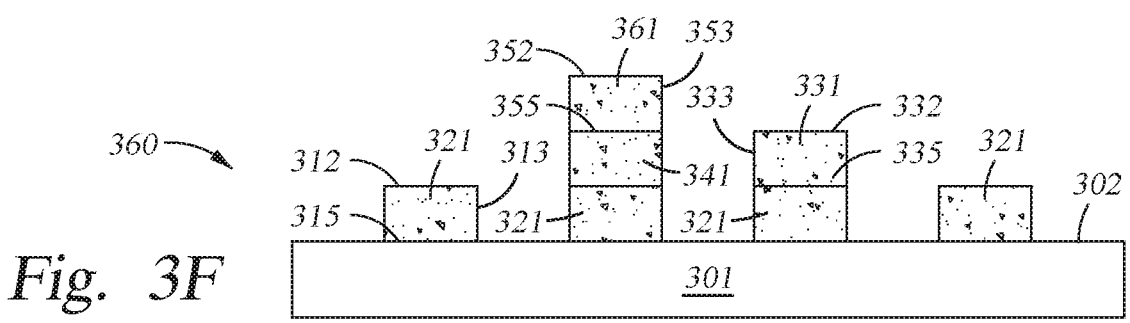

At block 360 shown in FIG. 3F, a treatment is performed on the third FML 351 to form a third treated FML 361. The third treated FML 361 is a changed composition for the material of the third FML 351. The treatment alters the structure of the third FML 351 to yield the third treated FML 361, a more robust material suitable for stacking and substantially chemically inert to subsequent layers which may be disposed thereon. The third treated FML 361 is substantially similar to the first treated FML 321 and the second treated 341. Alternately, the third treated FML 361 may utilize a different treatment technique than either the first treated FML 321 or the second treated FML 341.

It should be appreciated that the layers may continue to be stacked well beyond three layers. Each layer merely needs to be chemically compatible with an adjacent layer with the treatment changing the material composition to facilitate the compatibility. The operations outlined above may be repeated any number of times to produce a complex and highly sophisticated 3D optical structure as illustrated in FIGS. 8A through 8E. However, as will be disclosed with respect to the embodiment of a third method 400 disclosed in FIGS. 4A through 4C, the highly sophisticated 3D optical structures may be created by yet another technique.

Figure 4A:
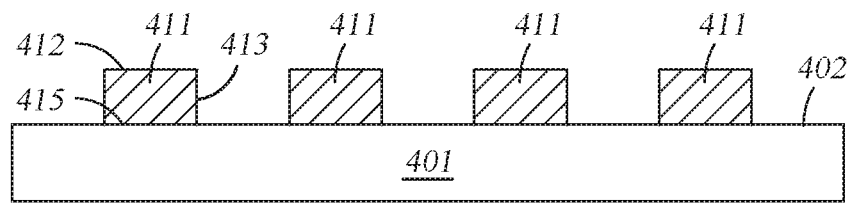
FIGS. 4A through 4C illustrate a third method for building 3D functional optical material level structure on a substrate using a technique of alternating pairs of materials.
Figure 4B:
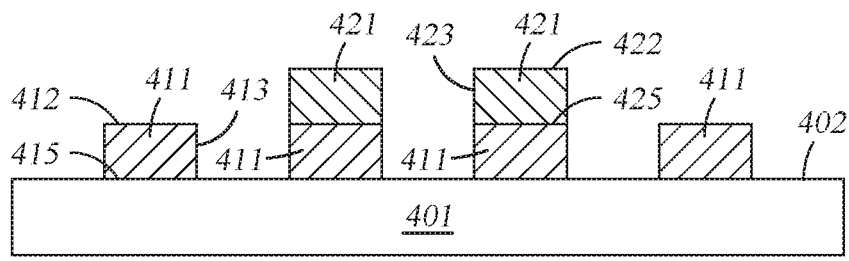
Figure 4C:
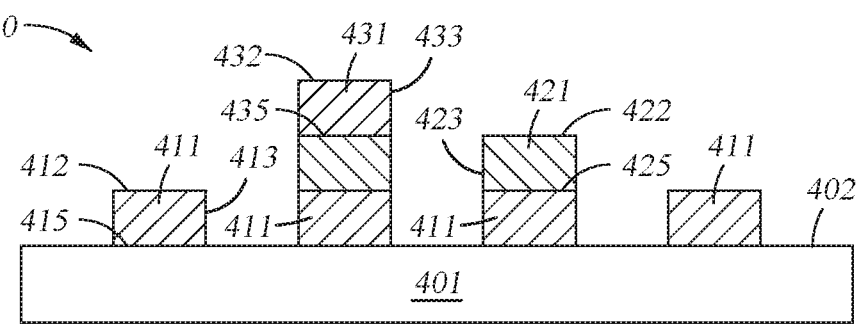

FIGS. 4A through 4C illustrate the third method 400 for building 3D functional optical material level structures on a substrate using a technique of alternating pairs of materials. For example, a first level may be formed from a material A and a second level may be formed from a material B, where material A after formation is compatible with material B as it is formed thereon. For example, material A may be a sol-gel base material and material B can be a polymer based material. As such, a solvent of material B would not dissolve or interact negatively with material A. Each 3D functional optical material level structure further described here in FIGS. 4A through 4C, has a thickness, or height, of between about 20 nm to about 1 micron, such as about 200 nm.

At block 410 shown in FIG. 4A, one or more first functional material levels (FML) 411 are formed on a top surface 402 of the substrate 401. The first FML 411 has an outer surface 413, a first top surface 412 and a first bottom surface 415. The first top surface 412 of the first FML 411 is provided opposite the first bottom surface 415. The first bottom surface 415 being disposed on the top surface 402 of the substrate 401. The first FML 411 being formed from a first material A.

At block 420 shown in FIG. 4B, one or more second functional material levels (FML) 421 are formed on one or more of the first top surface 412 of the first FML 411. Each second FML 421 is disposed on one, but not necessarily all, of the first FML 411. The second FML 421 has an outer surface 423, a second top surface 422 and a second bottom surface 425. The second FML 421 is formed from a second material B. The material B of the second FML 421 is compatible with the material A of the first FML 411 such that the second FML 421 does not chemically or otherwise attack the first FML 411.

At block 430 shown in FIG. 4C, one or more third functional material levels (FML) 431 are formed on top of the one or more of the second top surface 422 of the second FML 421. Each third FML 431 is disposed on one, but not necessarily all, of the second FML 421. The third FML 431 is formed from material A. The third FML 431 is of the same material A as that of the first FML 411. The material A of the third FML 431 is compatible with the material B of the second FML 421 such that the third FML 431 does not chemically or otherwise attack the second FML 421.

It should be appreciated that by alternating material A and material B, the number of levels may continue to be stacked well beyond three levels. Each level chemically compatible with an adjacent layer to facilitate rapid building of the 3D structure with a minimum number of operations. For example, repeated cycles of deposit, etch, and planarization at each level is unnecessary. The operations outlined above may be repeated any number of times to produce a complex and highly sophisticated 3D optical structure as illustrated in FIGS. 8A through 8E. However, as will be disclosed with respect to the embodiment of a fourth method 500 disclosed in FIGS. 5A through 5C, the highly sophisticated 3D optical structures may be created by yet another technique.

Figure 5A:
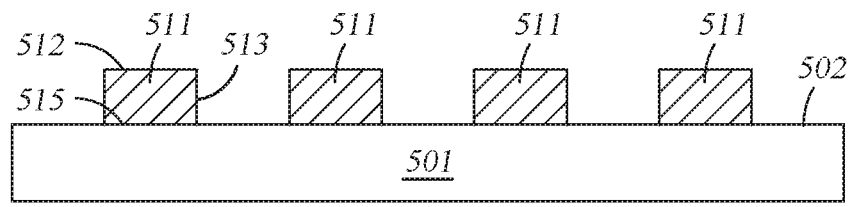
FIGS. 5A through 5C illustrate a fourth method for building 3D functional optical material level structure on a substrate using a sol-gel technique.
Figure 5B:
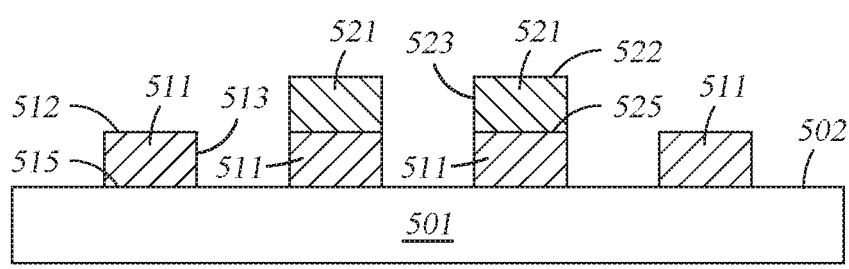
Figure 5C:
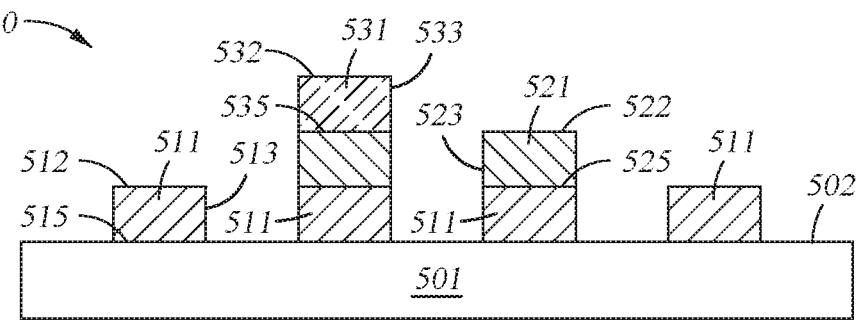

FIGS. 5A through 5C illustrate the fourth method 500 for building 3D functional optical material level structure on a substrate using a sol-gel technique. The sol-gel technique may be used for fabricating metal oxides, especially the oxides of silicon and titanium. The process involves conversion of monomers into a colloidal solution (sol) that acts as the precursor for an integrated network (or gel) of either discrete particles or network polymers. The solution (sol) gradually evolves towards the formation of a gel-like diphasic system containing both a liquid phase and solid phase whose morphologies range from discrete particles to continuous polymer networks. An underlying level is thus cured to form a compatible polymer that is robust enough to allow the colloidal solution of a subsequent level to be placed thereon. Each level further described here, has a finished thickness, or height, of between about 20 nm to about 1 micron, such as about 200 nm.

At block 510 as shown in FIG. 5A, one or more first functional material levels (FML) 511 are formed on a top surface 502 of a substrate 501. Each first FML 511 has an outer surface 513, a first top surface 512 and a first bottom surface 515. The first top surface 512 of the first FML 511 is provided opposite the first bottom surface 515. The first bottom surface 515 being disposed on the top surface 502 of the substrate 501. The first FML 511 is a sol-gel material which is deposited by spin coating or other suitable techniques on the substrate 501 as a solution and is densified to form a polymer network of material into a $SiO_x$. The first FML 511 is cured in preparation of stacking of additional levels.

At block 520 as shown in FIG. 5B, one or more second functional material levels (FML) 521 are formed on one or more of the first top surface 512 of the first FML 511. Each second FML 521 is disposed on one, but not necessarily all, of the first FML 511. Each second FML 521 has an outer surface 523, a second top surface 522 and a second bottom surface 525. The second FML 521 is formed from a sol-gel material similar to the solution used in the formation of the first FML 511. The solution of the second FML 521 is compatible with the polymer material of the first FML 511 such that the second FML 521 does not chemically or otherwise attack the first FML 511 and the second FML 521 can be stacked thereon. The second FML 521 is then cured in preparation of stacking of additional levels.

At block 530 as shown in FIG. 5C, one or more third functional material levels (FML) 531 are formed on top of the one or more of the second top surface 522 of the second FML 521. Each third FML 531 is disposed on one, but not necessarily on each, of the second FML 521. The third FML 531 is formed from a sol-gel material similar to the solution used in the formation of the first FML 511 and the second FML 521. The solution of the third FML 531 is compatible with the polymer material the second FML 521 such that the third FML 531 does not chemically or otherwise attack the second FML 521 and the third FML 531 can be stacked thereon. The third FML 531 is then cured in preparation of stacking of additional levels.

It should be appreciated that additional sol-gel levels of silicon oxide material may continue to be stacked well beyond the three levels discussed above. The sol-gel material levels are used to build up 3D structures such that cured sol-gel levels (forming $SiO_x$) are robust enough to withstand material interaction with subsequent sol-gel levels. Each level is chemically compatible with an underlying level to facilitate rapid building of the levels for the 3D structure with a minimum number of operations. The operations outlined above may be repeated any number of times to produce a complex and highly sophisticated 3D optical structure as illustrated in FIGS. 8A through 8E. However, as will be disclosed with respect to the embodiment of a fifth method 600 disclosed in FIG. 6 and shown in FIGS. 7A through 7J, the highly sophisticated 3D optical structures may be created by yet another technique.

Figure 6:
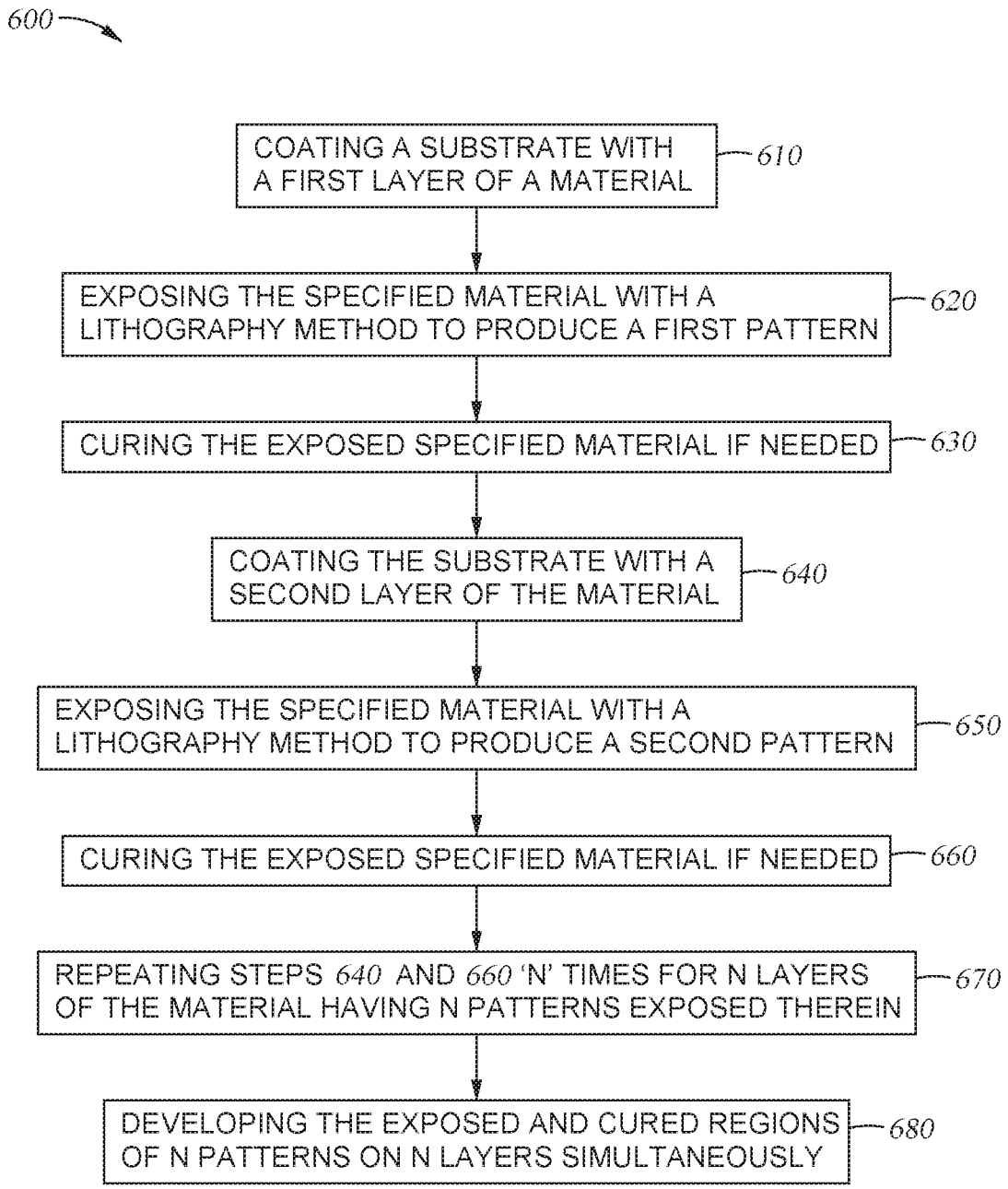
FIG. 6 shows a fifth method for forming a sub-micron 3D optical material structure on a substrate without planarization.

FIG. 6 and FIGS. 7A through 7J will now be discussed together. FIG. 6 shows a fifth method 600 for forming a sub-micron 3D optical material structure on a substrate without planarization. FIGS. 7A through 7J may be used to illustrate the fifth method 600 of FIG. 6 for building 3D functional optical material level structure on a substrate using repetitive coating and exposure technique.

The fifth method 600 begins at block 610 by coating a substrate 701 with a first resist layer 711 of a material. The material may be a resist layer. The substrate 701 is acquired and a $SiO_2$ layer is grown thereon in preparation of the first layer of material in step 705 shown in FIG. 7A. The $SiO_2$ may be formed by thermal oxide growth. The technique forces an oxidizing agent to diffuse into the substrate at high temperatures and react with it. The $SiO_2$ layer is grown to about 100 nm.

Figure 7G:
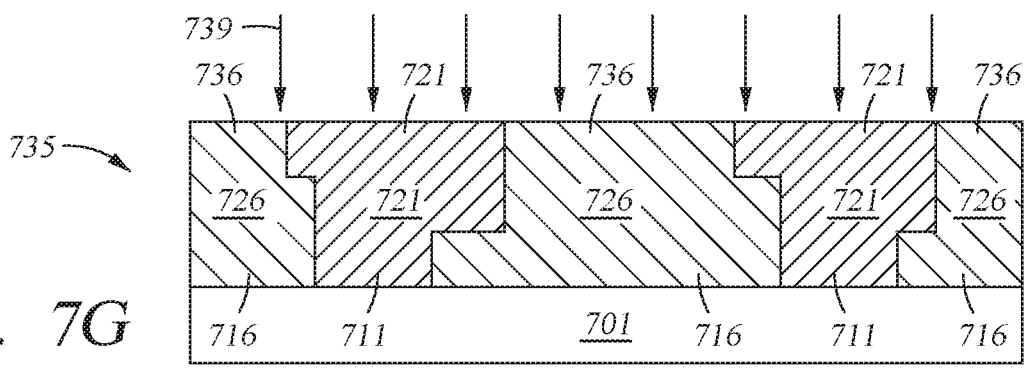

The first layer of material, the first resist layer 711, is applied to the substrate 701 at block 710 in FIG. 7B. The first resist layer 711 may be deposited, spin coated or placed thereon the substrate 701 by any suitable technique. In one embodiment, the first resist layer 711 is spin coated onto the substrate 701. The first resist layer 711, and each resist layer described below with respect to FIGS. 7A through 7J, has a thickness, or height, of between about 20 nm to about 1 micron, such as about 200 nm.

At block 620, the first resist layer 711 is exposed with a lithography method to produce a first pattern. At block 630, the exposed the first resist layer 711 may be cured if needed. Block 715 shown in FIG. 7C, illustratively shows the first resist layer 711 exposed through a mask forming the first pattern and the first layer being baked, i.e., cured. The exposure and baking process 719 results in the first resist layer 711 forming a plurality of first cured material level 716 in the locations which were exposed through the mask and then baked. The exposure and baking process 719 may be a blanket electromagnetic radiation exposure operation. The mask may be a fine metal mask, digital mask (maskless) or other technique for forming an image on the first resist layer 711 by projecting energy therethrough. It should be appreciated that the arrows representing the exposure and baking process 719 only act on the first cured material level 716 through the mask and not the un-exposed the first resist layer 711.

At block 640, the substrate is coating with a second resist layer 721 of the material. The second resist layer 721 is shown at block 720 in FIG. 7D formed on to the first layer containing the first resist layer 711 and the first cured material level 716. The second resist layer 721 may utilize a spin coating technique for applying the second resist layer 721 to the underlying layers, i.e., the first cured material level 716 and the first resist layer 711. The second resist layer 721 may be applied to the underlying layers without planarization of the underlying layers. The material of the second resist layer 721 is substantially the same as the material of the first resist layer 711.

At block 650, the second resist layer 721 is exposed with a lithography method to produce a second pattern. At block 660, the exposed the second resist layer 721 may be cured if needed. An exposure and baking process 729 is shown block 725 shown in FIG. 7E. The exposure and baking process 729 results in the second resist layer 721 forming a plurality of second cured materials level 726 in the locations which were exposed through the mask. The second cured materials level 726 is formed on the first cured material level 716. However, not all of the first cured material level 716 has the second cured materials level 726 formed thereon. The material of the second cured materials level 726 may be substantially similar to that of the first cured material level 716.

At block 670, the blocks 640 through blocks 660 may be repeated 'n' times for n layers of the resist material having n patterns exposed therein. N is an integer corresponding to the number of levels for the sub-micron 3D optical structure. For example, the sub-micron 3D optical structure may have N equal to 4, 8, 16, 32 layers/levels, or maybe more.

In one purely illustrative example, N may be equal to 4 corresponding to 4 layers of resist. This is shown at block 730, FIG. 7F, wherein a third resist layer 731 is formed on to the second layer having the second resist layer 721 and the second cured materials level 726. The third resist layer 731 may utilize a spin coating technique for applying the third resist layer 731 to the underlying layers, i.e., the second cured materials level 726 and the second resist layer 721. The third resist layer 731 may be applied to the underlying layers without planarization of the underlying layers. The material of the third resist layer 731 is substantially the same as the material of the first resist layer 711 and the second resist layer 721.

At block 735 shown in FIG. 7G, the third resist layer 731 is expose and bake through a mask. An exposure and baking process 739 results in the third resist layer 731 forming a plurality of third cured materials 736 in the locations which were exposed through the mask. The third cured materials 736 may be substantially similar to the first cured material level 716 and the second cured materials level 726. However, it should be appreciated the third cured materials 736 is formed only on the second cured materials level 726 yet not all the second cured materials level 726 have the third cured materials 736 formed thereon. For example, the mask may pattern the third resist layer 731 such that one of the second cured materials level 726 may have the third resist layer 731 thereon after the exposure and baking process.

Figure 7H:
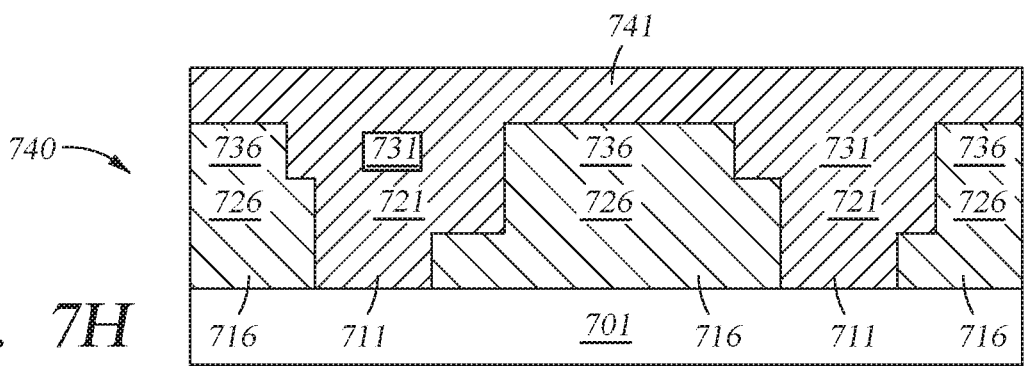

At block 740 shown in FIG. 7H, a fourth resist layer 741 is formed on to the third layer having the third resist layer 731 and the third cured materials 736. The fourth resist layer 741 may utilize a spin coating technique for applying the fourth resist layer 741 to the underlying layers, i.e., the third cured materials 736 and the third resist layer 731. The fourth resist layer 741 may be applied to the underlying layers without planarization of the underlying layers. The material of the fourth resist layer 741 is substantially the same as the material of the first resist layer 711, the second resist layer 721 and the third resist layer 731.

Figure 7I:
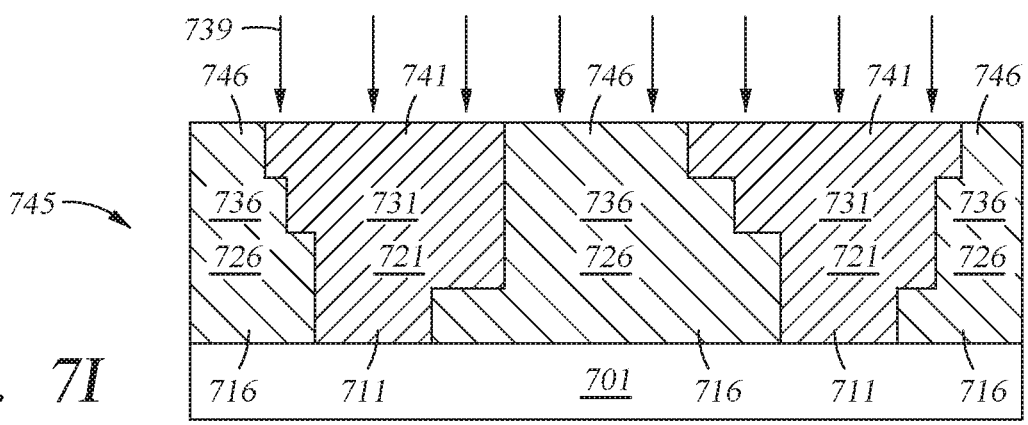

At block 745 shown in FIG. 7I, the fourth resist layer 741 is expose and bake through a mask. An exposure and baking process 749 results in the fourth resist layer 741 forming a plurality of fourth cured materials 746 in the locations which were exposed through the mask. The fourth cured materials 746 may be substantially similar to the first cured material level 716, the second cured materials level 726, and the third cured materials 736. However, it should be appreciated the fourth cured materials 746 is formed only on the third cured materials 736 yet not all the third cured materials 736 have the fourth cured materials 746 formed thereon. Alternately, the intermediate steps may forgo curing and have just one final curing step prior to development.

It should be appreciated that the aforementioned steps of spin coating a resist and exposing the resist through a mask and backing to form the cured materials can be repeated to form multiple layers and complex 3D structures.

Figure 7J:
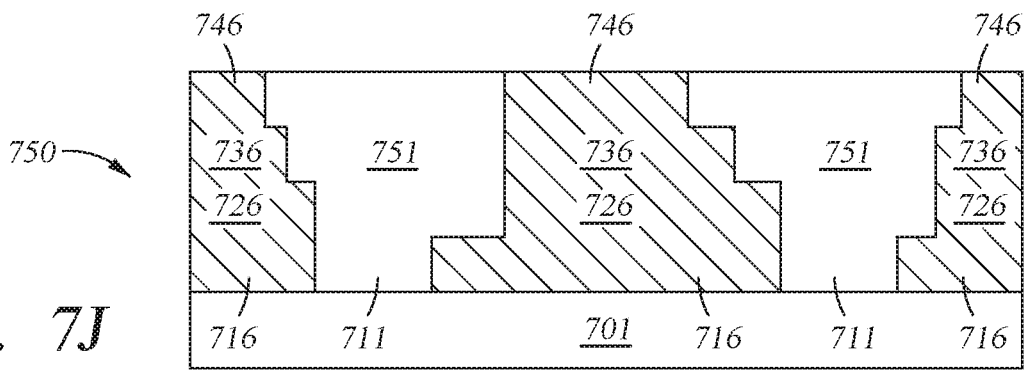

At block 680, the exposed and cured regions of the n patterns on n layers are simultaneously developed. Block 750 shown in FIG. 7J, illustrates the developed 3D structure. The fourth resist layer 741, the third resist layer 731, the second resist layer 721 and the first resist layer 711 are all removed by the development process leaving a void 751, or no material, where once the resist material previously occupied. The effect is only the 3D structure formed from the fourth cured materials 746, the third cured materials 736, the second cured materials level 726 and the first cured material level 716 are left behind on the substrate 701.

The conventional approach for building 3D functional optical material structure on a substrate may involve a multitude of operations which may include operations for $SiO_2$ thermal oxide growth, Cu physical vapor deposition (PVD) deposition, Cu electrochemical plating (ECP), and lithography. Each layer repeatedly performing the steps for Cu ECP, Chemical Mechanical polishing (CMP), stop on resist and lithography prior to removing the resist. The fifth method 600 can build the same 3D functional optical material level structure in as little as ten process steps. Therefore, the fifth method 600, illustrated above, provides savings of time and resources for building a 3D pattern suitable for generating the 3D functional optical structure resulting in significant savings in time, material and factory resources.

FIGS. 8A through 8E provides an illustration for the construction for a 3D functional optical material level structure (3D structure) 800 on a substrate 801. The 3D structure 800 may be asymmetrical or symmetrical. A grid is provided having a Y-axis 891 with units of a 'levels' and an X-axis 892 with units of 'unit piece'. The units along the Y-axis have a thickness, or height, of between about 20 nm to about 1 micron, such as about 200 nm. Additionally, the units along the X-axis have a width, or length, of between about 20 nm to about 1 micron, such as about 200 nm. The preceding methods discussed above in FIGS. 2A through 7J enable the fabrication of the 3D structure at sub-micron scales. Although the 3D structure 800 is shown built level by level, this is done for clarity and it should be appreciated that the voids and cavities therein may be formed after all the levels for the 3D structure 800 are in place. For example, the final step of developing may remove all the material (resist) in certain areas down to the first level while leaving material in other locations for building the 3D structure 800. Or alternately, the processes for building the levels of the 3D structure 800 may be additive and the voids and cavities therein are formed when each level of construction for the 3D structure 800 as the material is put in place.

Figure 8A:
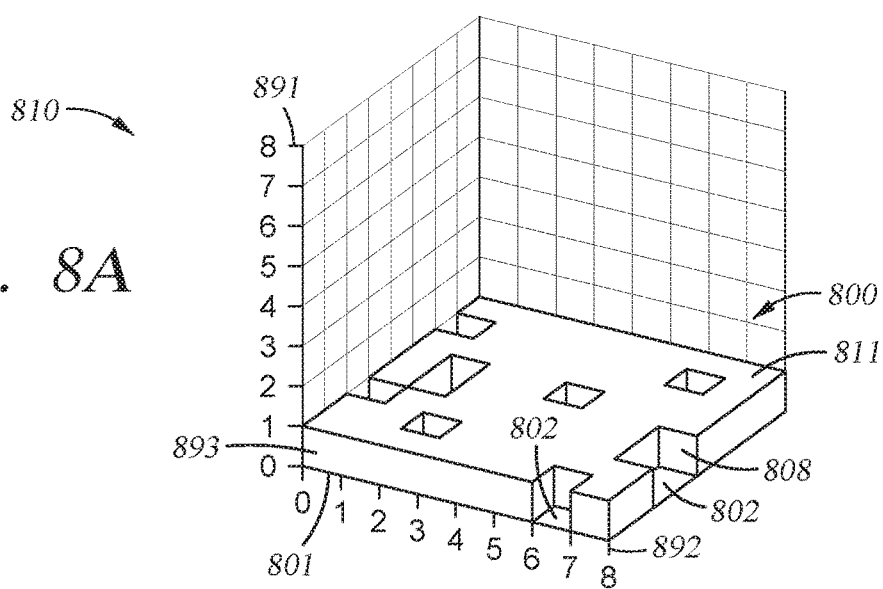
FIGS. 8A through 8E provides an illustration for the construction for the 3D functional optical material level structure on a substrate.

At block 810 shown in FIG. 8A, a first layer 811 of a material 808 is provided on the substrate 801. The first layer 811 may be formed from a plurality of unit pieces, such as unit piece 893. The unit piece 893 may have a length, height and width of each between about 20 nm to about 1 micron, such as about 200 nm. The material 808 of the unit pieces 893 may be formed from a material compatible with the methodology utilized from above. For example, with respect to method 600, the unit pieces 893 are formed from a resist material. The first layer 811 has a plurality of vias or voids 802 therein, i.e., absent the unit pieces 893, and may form a layer in a complicated and customized 3D structure.

Figure 8B:
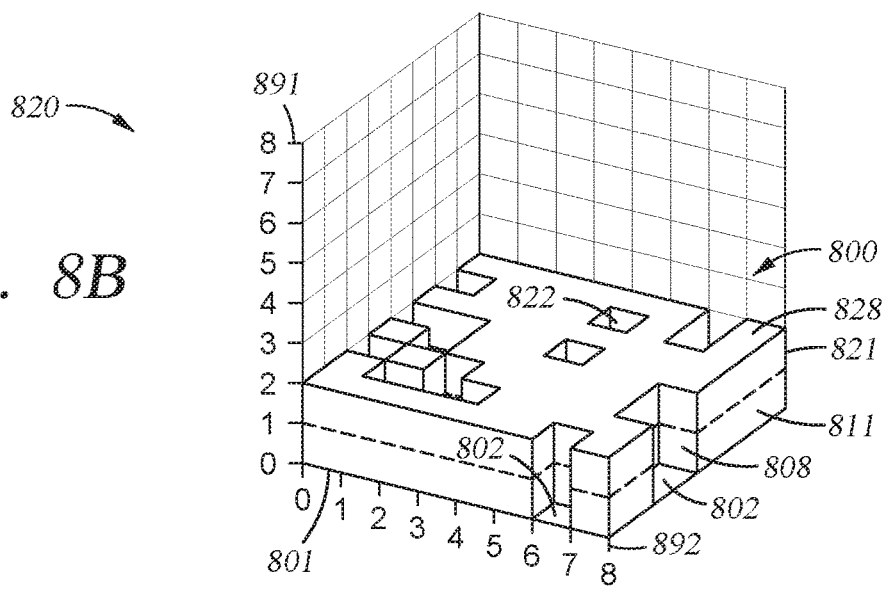

At block 820 shown in FIG. 8B, a second layer 821 of material 828 is provided on top of the material 808 of the first layer 811. The material 828 is available only on the top of the material 808 of the first layer 811 and not provided in the voids 802. Additionally, one or more new voids 822 are formed in the second layer 821.

Figure 8C:
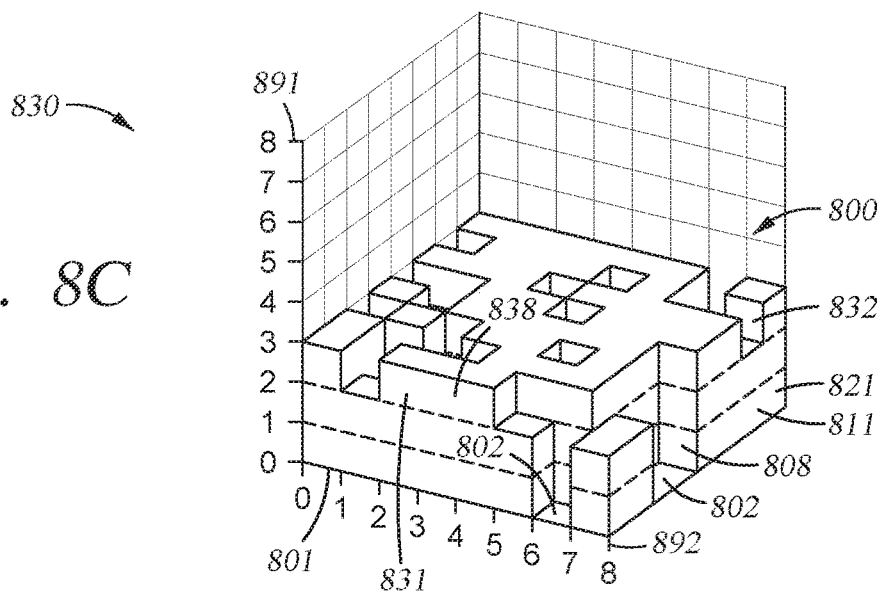

At block 830 shown in FIG. 8C, a third layer 831 of material 838 is provided on top of the material 828 of the second layer 821. The material 838 is available only on the top of the material 828 of the second layer 821 and not provided in the voids 802, or the material 808 of the first layer 811. Additionally, one or more new voids 832 are formed in the third layer 831.

Figure 8D:
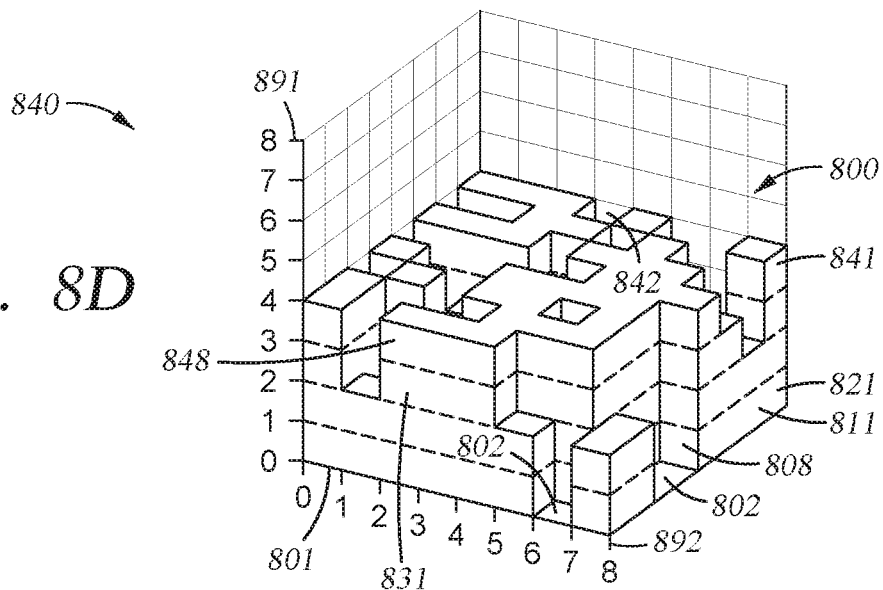

At block 840 shown in FIG. 8D, a fourth layer 841 of material 848 is provided on top of the material 838 of the third layer 831. The material 838 is available only on the top of the material 838 of the third layer 831 as similarly discussed above. Additionally, one or more new voids 842 are formed in the fourth layer 841.

Figure 8E:
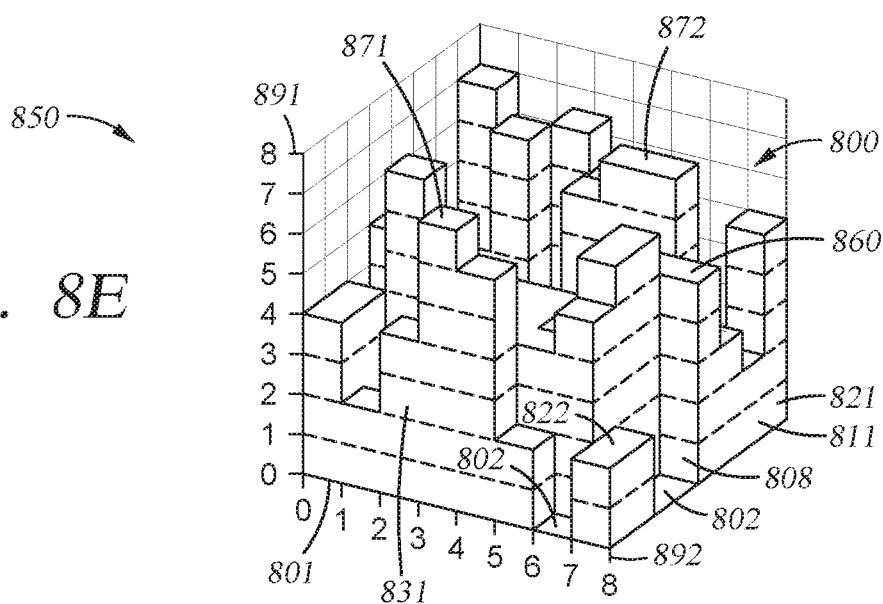

As shown above, a multitude of layers may be stacked to form 3D structure 800 having four (4), eight (8), sixteen (16), thirty two (32) or more layers of material. Each layer having structures at a sub-micron scale. At step 850 as shown in FIG. 8E, a seventh layer 871 of material is provided on the substrate 801 to form the 3D structure 800. 3D structure 800 may be formed with unit pieces 893 at a scale of between about 20 nm to about 1 micron, such as about 200 nm. Thus, the methodologies described above may advantageously form fully customizable 3D optical structure at the sub-micron level suitable for forming 3D optical operations such as holograms.

Figure 9:
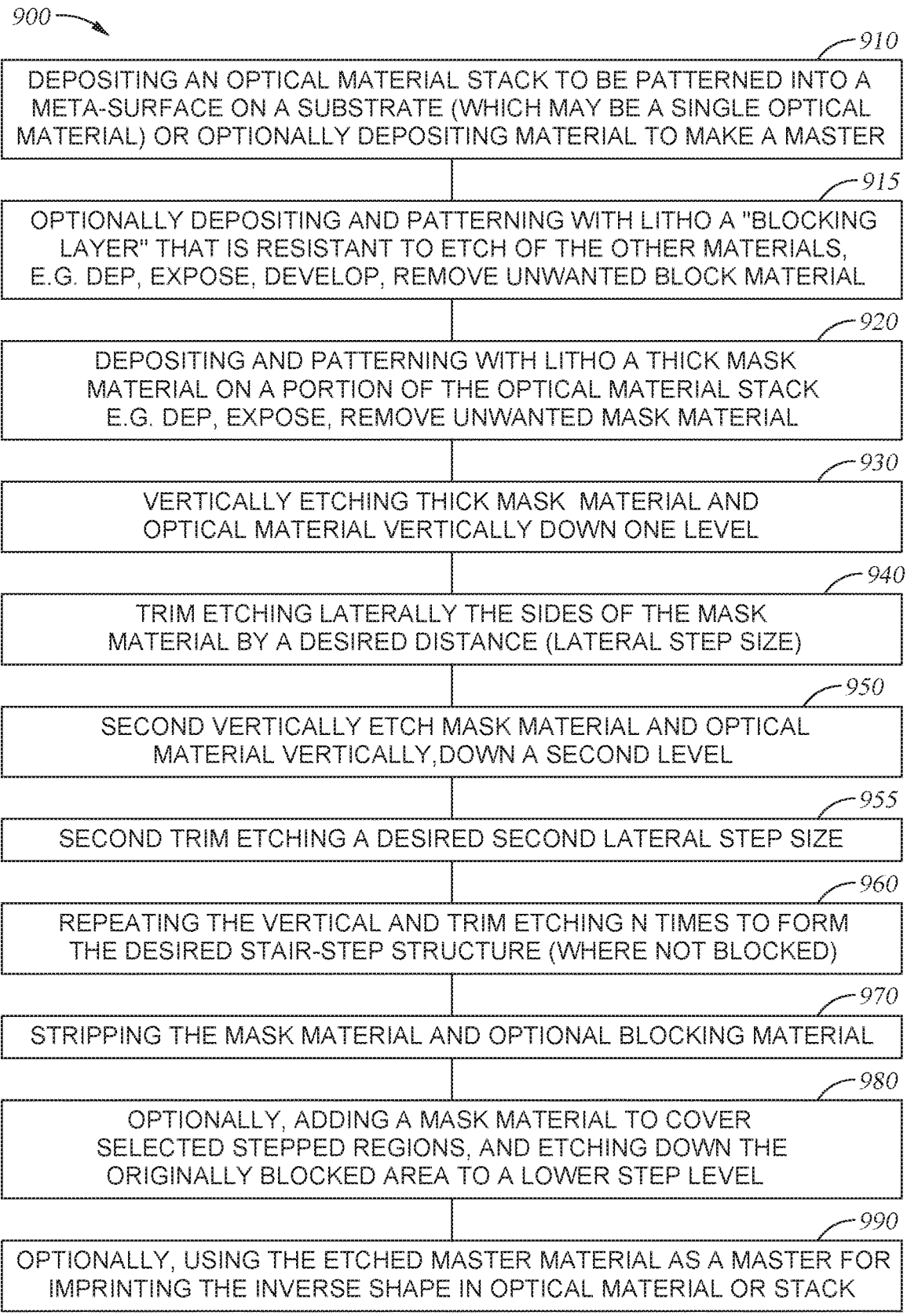
FIG. 9 shows a method for forming a sub-micron 3D optical material structure on a substrate without planarization.

In addition to the methods disclosed above for forming fully customizable 3D optical structure at the sub-micron level, methods below describe alternative methods for forming similarly sized symmetrical 3D structures. FIG. 9 shows a method 900 for forming a sub-micron 3D optical material structure on a substrate without planarization. FIGS. 10A through 10G illustrates the method 900 of FIG. 9 for making symmetric 3D optical structure. The symmetric 3D optical structure 1000 is symmetric about a center of the symmetric 3D optical structure 1000.

The method 900 starts at block 910, wherein an optical material stack, i.e., film stack 1008, to be patterned into a diffractive optics element is deposited on a substrate 1001. The substrate 1001 may be a single optical material. The depositing material may be used to make a master for forming an 3D optical structure wherein the master is transposed from the final 3D optical structure. The film stack 1008 may be a resist material for forming features in the substrate below or the film stack 1008 may be a plurality of materials suitable to form the final 3D optical features.

Figure 11A:
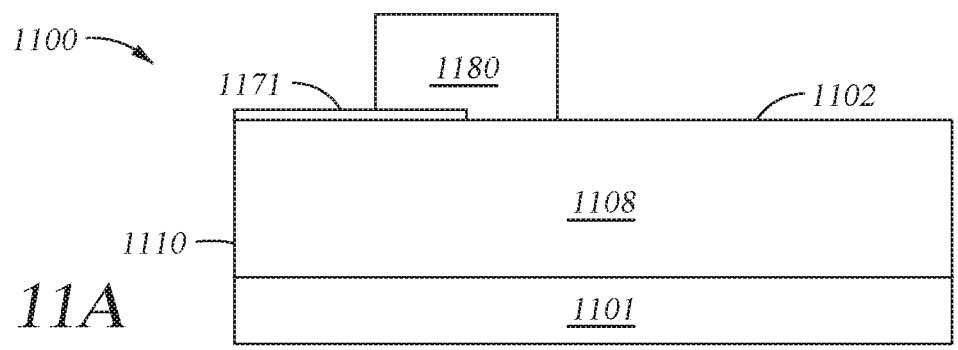
FIGS. 11A through 11E illustrate a method for making a one or more sided stepped 3D optical structure.

At block 915, a "blocking layer", such as hardmask 1171 in FIG. 11A, that is resistant to etch of the other materials may optionally be deposited and patterned with lithography. The formation of the blocking layer may be performed in a series of steps which deposit, expose, develop, and remove unwanted block material. This step will be described further below with respect to step 1110 shown in FIG. 11A.

Figure 10A:
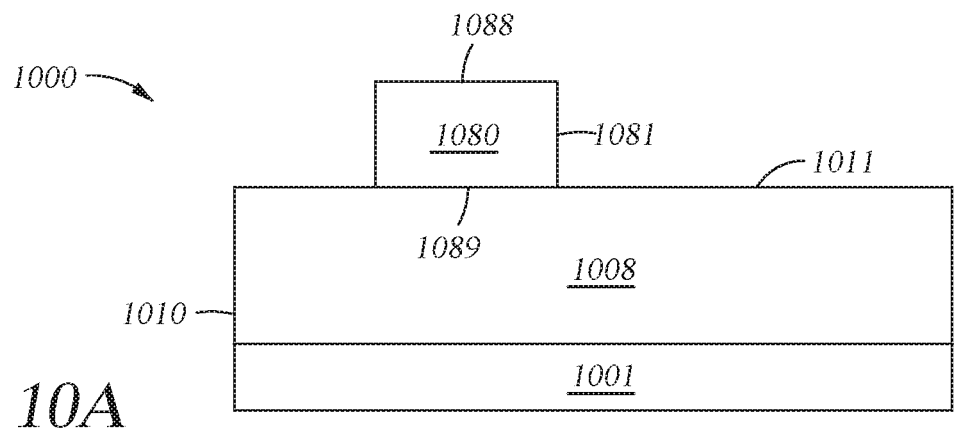
FIGS. 10A through 10G illustrates the method of FIG. 9 for making symmetric 3D optical structure.

Resuming with block 920, a mask material 1080 is deposited and patterned on a portion of the film stack 1008. In FIG. 10A, step 1010 shows the mask material 1080 placed on a top surface 1011 of the film stack 1008. The mask material 1080 has an upper surface 1088, a bottom surface 1089, and side surfaces 1081. The mask material 1080 may be a photo resist or other suitable mask material. The formation of the mask material 1080 may be performed in a series of steps which deposit, expose, and remove unwanted mask material 1080.

Figure 10B:
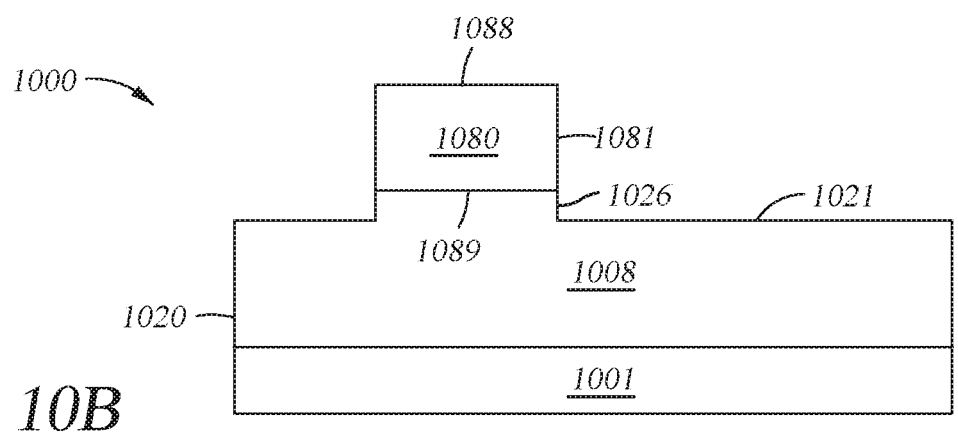

At block 930, the film stack 1008 is etched down one level. The film stack 1008 is shown in FIG. 10B at step 1020 etched one layer down. It should be appreciated that the layer, and each layer subsequently described with respect to method 1000, has a thickness, or height, of between about 20 nm to about 1 micron, such as about 200 nm. The mask material 1080 prevents a first layer portion 1026 of the film stack 1008 from being etched. The top surface 1011 of the film stack 1008 is preserved under the mask material 1080 while areas of the film stack 1008 is etched down to expose a new, i.e., second top surface 1021 one layer down.

Figure 10C:
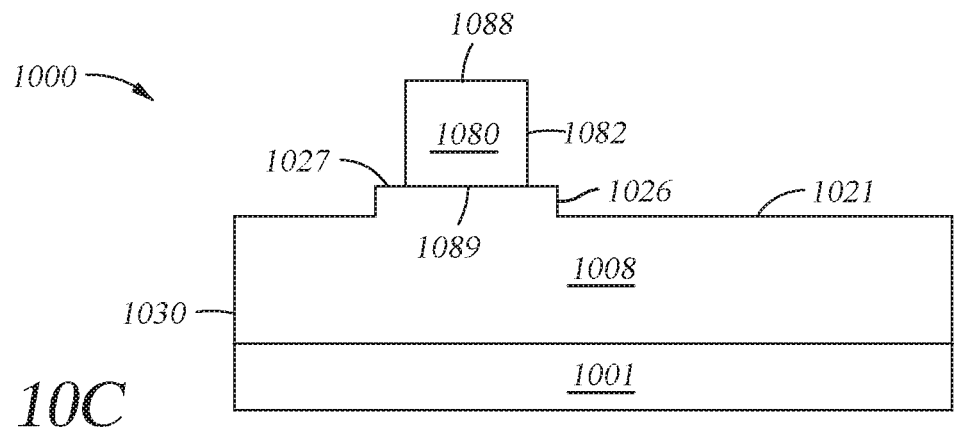

At block 940, a side portion of the mask material 1080 is trim etched laterally by a desired distance. The desired distance for the trim etch may correspond to a lateral step size, for example, first layer top portion 1027. FIG. 10C show the mask material 1080 trimmed on the side surfaces 1081 to reveal a plurality of new, i.e., second sides 1082 at step 1030. The trimming of the mask material 1080 makes the width thereof smaller, i.e., the distance between second sides 1082 is less than the distance between side surfaces 1081 original to the mask material 1080 prior to trimming. The second sides 1082 expose a first layer top portion 1027 which is no longer covered by the mask material 1080. The mask material 1080 is trimmed along each of the sides between about 20 nm to about 1 micron, such as about 200 nm. Thus making the first layer top portion 1027 between about 20 nm to about 1 micron, such as about 200 nm.

Alternately, the mask material 1080 is selectively trim etched, for example by directional etching.

Figure 10D:
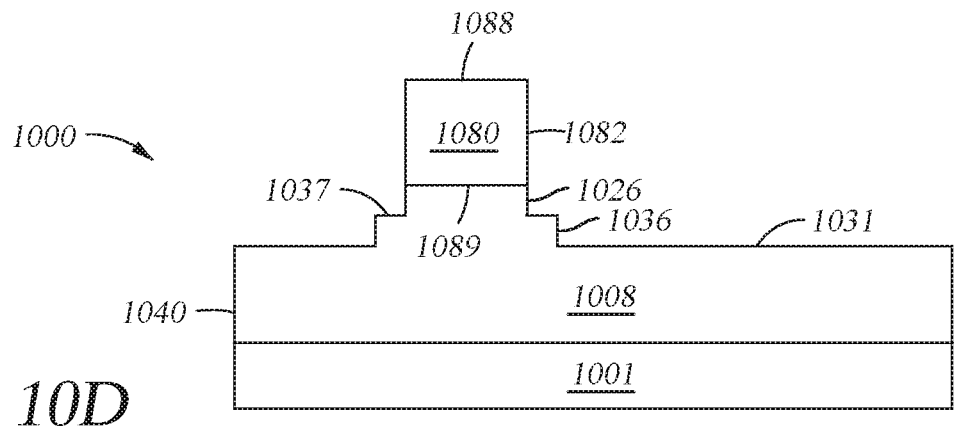
Figure 10E:
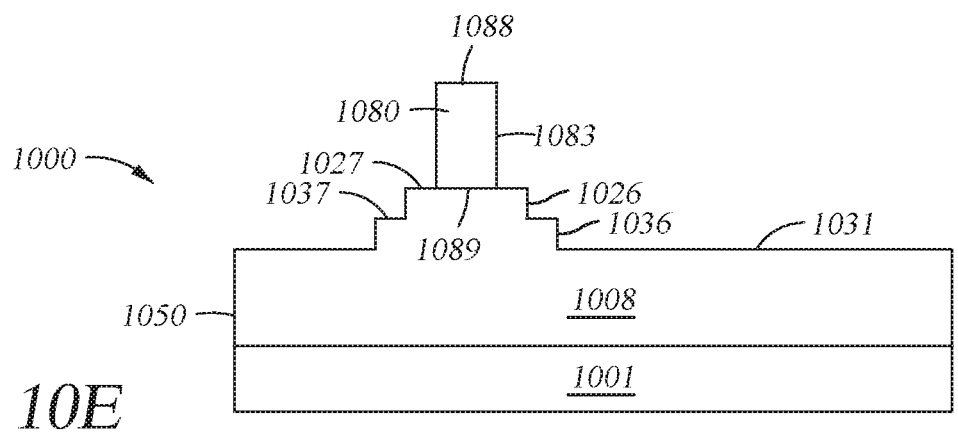

At block 950, a second vertical etch is performed on the mask material 1080 and optical material, i.e., film stack 1008, vertically down a $2^{nd}$ level. FIG. 10D illustrates the film stack 1008 etched one layer further down to expose a second layer portion 1036 at step 1040. The mask material 1080 prevents the film stack 1008 directly thereunder, i.e., the first layer portion 1026 covered by the mask material 1080 and the second layer portion 1036 covered by the first layer portion 1026, from being etched. The top surface 1011 of the film stack 1008 is preserved under the mask material 1080 while areas of the film stack 1008 is etched down to expose a new, i.e., third top surface 1031, and the second layer portion 1036. Additionally, a second layer top portion 1037 is exposed while etching through the first layer top portion 1027.

At block 955, a second trim etching is performed to form a desired second lateral step size. The sequence of steps may be repeated. At block 960, the trim operation (block 940) and etch operation (block 950) are repeated 'N' times to form the desired stair-step structure where not optionally blocked by the blocking layer at block 915. N is an integer corresponding to the number of levels for the sub-micron 3D optical structure. For example, the sub-micron 3D optical structure may have N equal to the number of levels for the sub-micron 3D optical structure. The sub-micron 3D optical structure may have 4, 8, 16 32 or more levels.

In one purely illustrative example, N is equal to 3 corresponding to 3 levels of etch and trim. At block 1050 shown in FIG. 10E, the mask material 1080 is trimmed on the second sides 1082 to reveal a plurality of new, i.e., third sides 1083, further shrinking a width of the mask material 1080. The third sides 1083 again exposes the first layer top portion 1027 which is no longer covered by the mask material 1080.

Figure 10F:
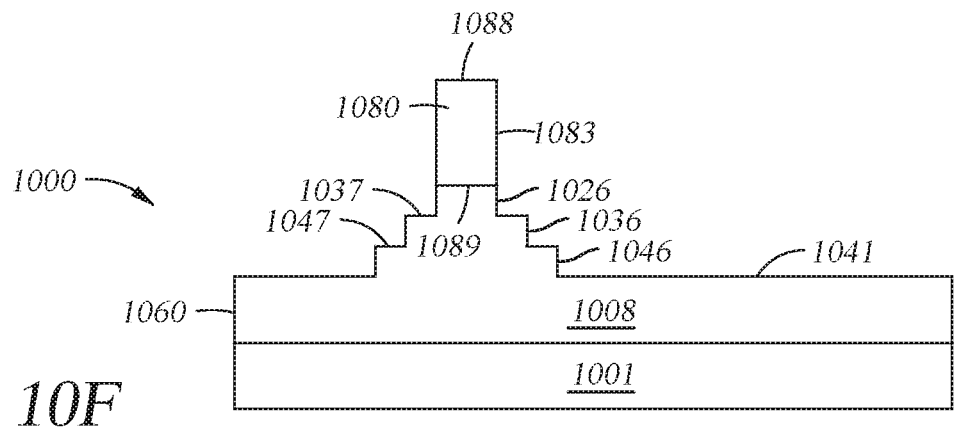
Figure 10G:
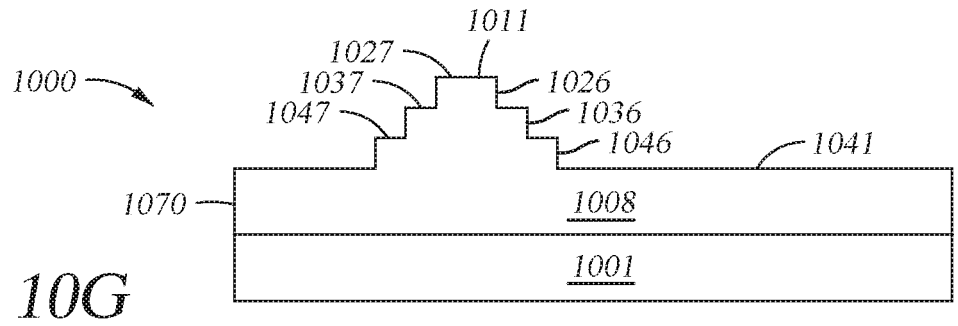

At block 1060 shown in FIG. 10F, the film stack 1008 is etched further one layer down to expose a third layer portion 1046. The mask material 1080 prevents the film stack 1008 directly thereunder from being etched. The top surface 1011 of the film stack 1008 is preserved under the mask material 1080 while areas of the film stack 1008 is etched down to expose a new, i.e., fourth top surface 1041 and a third layer top portion 1047 of the third layer portion 1046.

At block 970, the mask material 1080 is stripped from the film stack 1008. The optional blocking material is stripped as well if it is present. At step 1070 shown in FIG. 10G, the mask material 1080 is stripped off to reveal the 3D optical structure 1099. A profile for the third layer portion 1046, the second layer portion 1036, and the first layer portion 1026 is symmetric about a center of the 3D optical structure 1099. It should be appreciated that the preceding steps of etching and trimming can be repeated any number of times to produce symmetrical 3D structures having a multitude of layers prior to stripping the mask material 1080 wherein each layer has a thickness, or height, of between about 20 nm to about 1 micron, such as about 200 nm. It should also be appreciated that the trimming of the sides for the mask material 1080 may optionally be skipped for one or more layers where a straight vertical wall is desired over a stepped wall.

At block 980, a mask material may optionally be added to cover selected stepped regions, and etching down the originally blocked area to a lower step level. This operation is described with respect to block 1140 shown in FIG. 11D below.

Resuming with block 990, the 3D optical structure 1099 may optionally be used as a master for imprinting the inverse shape in an optical material or stack. The 3D optical structure 1000 is shown symmetrical but may incorporate a stepped structure through the use of the optional blocked material. It should be appreciated that the steps may be irregular as will be further discussed below with respect to FIGS. 12A through 13C.

As will be disclosed now with respect to method 1100, the embodiment of method 1000 disclosed in FIGS. 10A through 10G can be further modified to yield a one sided, two sided or three sided stepped 3D optical structure. FIGS. 11A through 11E illustrate a method 1100 for making a one or more stepped sided 3D optical structure 1199. A film stack 1108 disposed on a substrate 1101 is provided for method 1100.

At block 1110 shown in FIG. 11A, a hardmask 1171 is disposed on a portion of a top surface 1102 of the film stack 1108. A mask material 1180 is placed on a portion of the hardmask 1171 and the top surface 1102 of the film stack 1108. In one embodiment, the hardmask 1171 extends halfway along a bottom surface of the mask material 1180. In another embodiment, the hardmask 1171 barely extends under the mask material 1180. The mask material 1180 may be a photoresist and operate similarly to mask material 1080 disclosed with respect to the method 1000 above in FIGS. 10A through 10G.

Figure 11B:
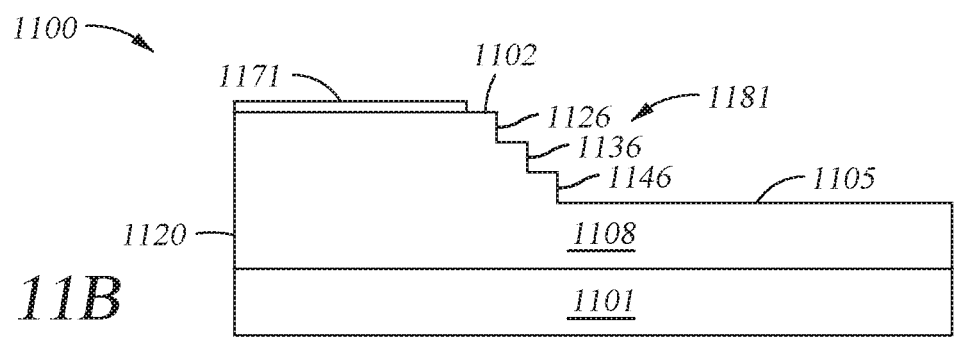

At block 1120 shown in FIG. 11B, the mask material 1180 is stripped off to reveal a 3D step structure 1181. The film stack 1108 was etched and the mask material 1180 was trimmed prior to block 1120 over a series of steps as illustrated in FIGS. 10A to 10G. The hardmask 1171 prevents any etching of the underlying film stack 1108. The top surface 1102 is etched down 3 layers to a fourth top surface 1105. As the mask material 1180 is disposed partially over the hardmask 1171, the steps illustrated in method 1000 only produces a portion, i.e., the 3D step structure 1181, in which the etch process was blocked or prevented by the hardmask 1171. The 3D step structure 1181 has a first step 1126, a second step 1136 and a third step 1146. Each of the first step 1126, the second step 1136 and the third step 1146 has a thickness, or height, of between about 20 nm to about 1 micron, such as about 200 nm. Additionally, the first step 1126 may extend from the second step 1136 and the second step 1136 may extend from the third step 1146 by a distance of between about 20 nm to about 1 micron, such as about 200 nm.

Figure 11C:
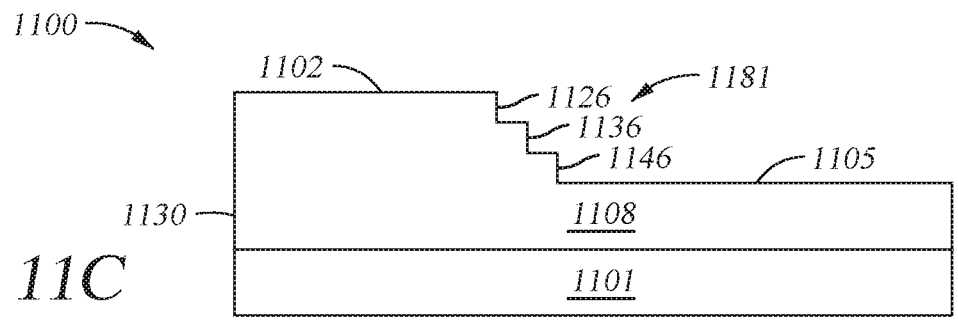

At block 1130 shown in FIG. 11C, the hardmask 1171 is stripped from the film stack 1108. The hardmask 1171 may be selectively removed leaving the top surface 1102, the 3D step structure 1181 and the fourth top surface 1105, i.e., the film stack 1108.

Figure 11D:
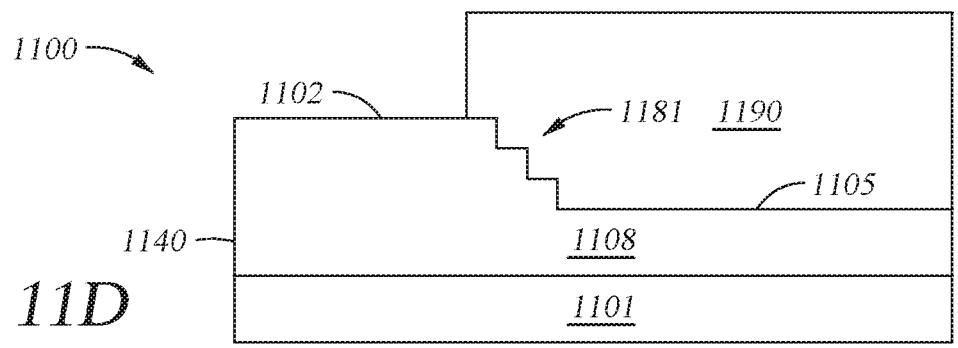

At block 1140 shown in FIG. 11D, a second mask material 1190 is disposed on the 3D step structure 1181 and the fourth top surface 1105. The second mask material covers a top of the 3D step structure 1181. The top may be of any suitable length. In one embodiment, the top has a single unit length of between about 20 nm to about 1 micron, such as about 200 nm.

Figure 11E:
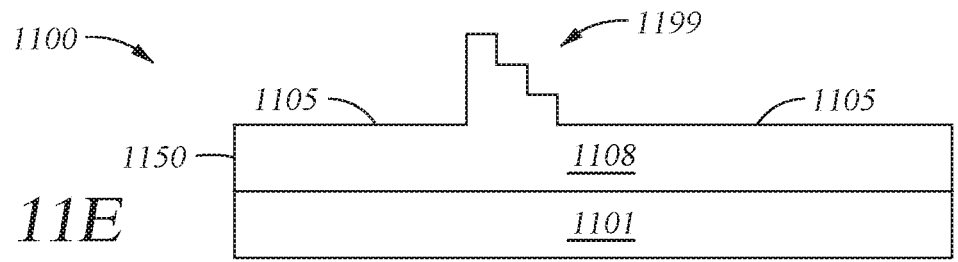

At block 1150 shown in FIG. 11E, the top surface 1102 exposed by the second mask material 1190 is etched down to the fourth top surface 1105. The second mask material 1190 is stripped to reveal the one sided stepped 3D optical structure 1199. The one sided stepped 3D optical structure 1199 may be a Fresnel lens or other optical device for projecting light. Alternately, the stepped 3D optical structure 1199 may have the 3D step structure 1181 on two or three sides.

Figure 12A:
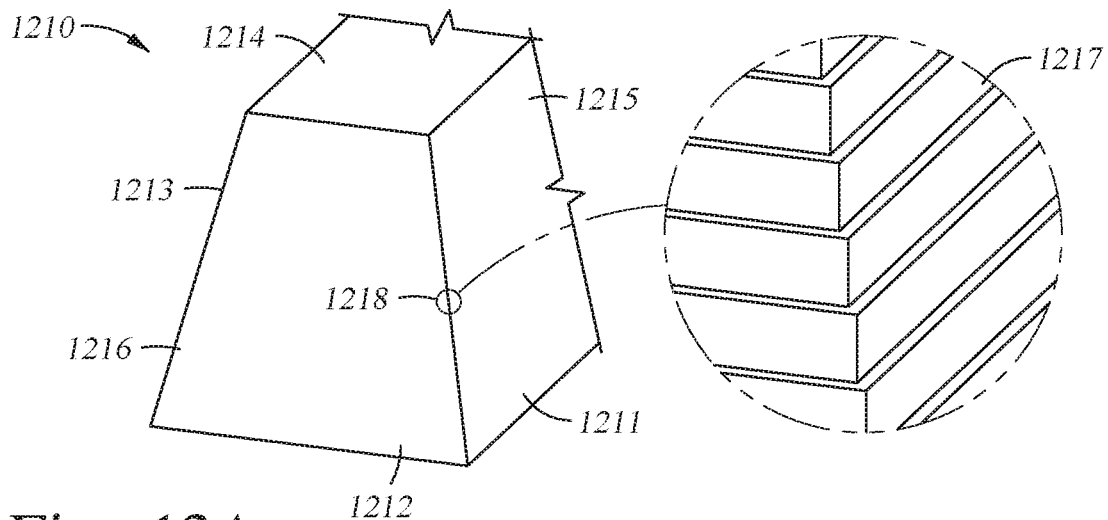
FIGS. 12A through 12C provides an illustration of a symmetrical 3D optical structure formed in the method of FIGS. 10A through 10G.
Figure 12B:
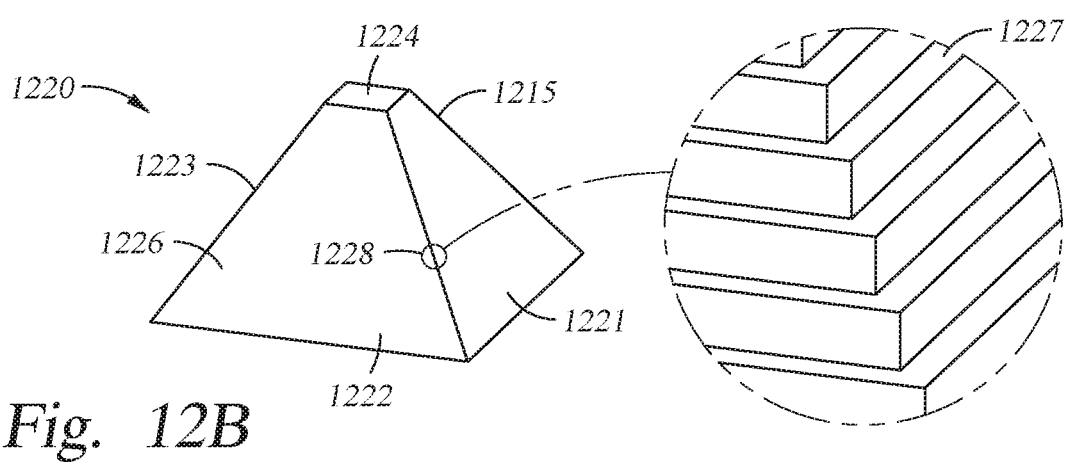
Figure 12C:
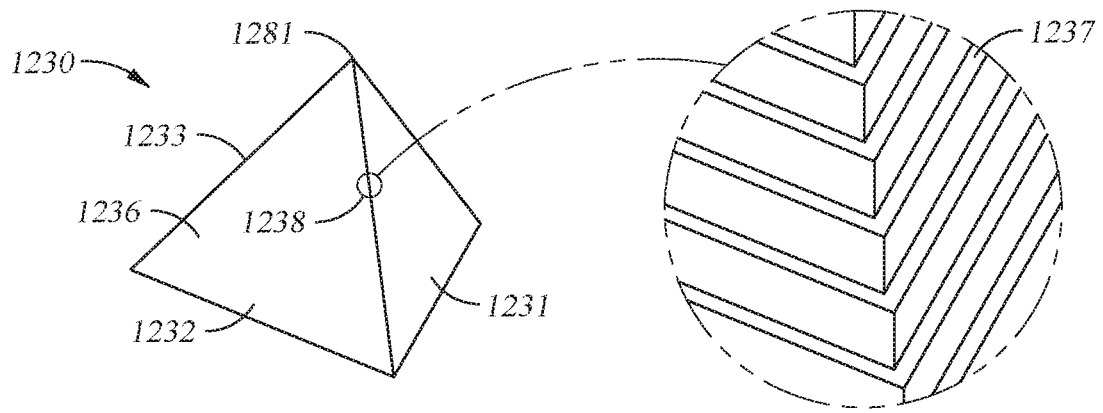

FIGS. 12A through 12C provides an illustration of a symmetrical 3D optical structure formed in the method of FIGS. 10A through 10G. For example, the 3D optical structure may have sides each having the steps formed therein. The sides of the 3D optical structure steps correspond to the size of the mask width and may be adjusted by adjusting the mask width. Although only three shapes are illustrated in FIGS. 12A through 12C, it should be appreciated that the shape of the 3D structure may be polygonal having any number of sides. Additionally, it should be appreciated that the slope of the sides may be altered by adjusting the step sizes formed thereon. For example, a step having a larger rise (level height) than a run (width) will yield a steeper incline angle for the side walls. The 3D optical structure represents one or more of the optical structures which may be formed on a diffractive optics element.

FIG. 12A illustrates a trapezoidal prism 1210. The trapezoidal prism 1210 is a three dimensional solid that has two congruent trapezoids for its front side 1212 and a far side (not visible). The trapezoidal prism 1210 has a top 1214, a bottom (not visible), a first side 1211 and a second side 1213, each rectangular in shape connecting the corresponding sides of the front side 1212 and the far side. Each of the first side 1211, the second side 1213, the front side 1212 and the far side may be angled from the bottom to the top 1214 such that the plan area of the bottom is larger than the plan area of the top 1214. Each of the first side 1211, the second side 1213, the front side 1212 and the far side may have grating, i.e., a large number of equidistant parallel lines or grooves on its surface, corresponding to sub-micron steps in the formation thereof. For example, a callout 1218 shows grating 1217 on a first surface 1216 on the front side 1212 and a surface 1215 of the first side 1211.

FIG. 12B illustrates a square frustum 1220 having step sides. The square frustum 1220 is a three dimensional solid that has four congruent trapezoids for its front side 1222, a far side (not visible), a first side 1221 and a second side 1223. The square frustum 1220 has substantially planar a top 1224 and a bottom (not visible) each connecting the corresponding sides of the front side 1222 the far side, the first side 1211 and the second side 1219. Each of the first side 1211, the second side 1223, the front side 1222 and the far side may be angled from the bottom to the top 1224 such that the plan area of the bottom is larger than the plan area of the top 1224. Each of the first side 1221, the second side 1223, the front side 1222 and the far side may have grating, i.e., a large number of equidistant parallel lines or grooves on its surface, corresponding to sub-micron steps in the formation thereof. For example, a callout 1228 shows grating 1227 on a first surface 1226 on the front side 1222 and a surface 1225 of the first side 1221.

FIG. 12C illustrates a triangular pyramid 1230 having step sides. The triangular pyramid 1230 is a three dimensional solid that has three congruent triangles for its front side 1232, a far side 1233, and a first side 1231. The triangular pyramid 1230 has an apex at a top 1281 and a substantially planar bottom (not visible) each connecting the corresponding sides of the front side 1232 the far side 1233, and the first side 1231. Each of the first side 1231, the far side 1233, and the front side 1232 may be angled from the bottom to the top 1234 forming the apex at the top 1234. Each of the first side 1231, the front side 1232 and the far side 1233 may have grating, i.e., a large number of equidistant parallel lines or grooves on its surface, corresponding to sub-micron steps in the formation thereof. For example, a callout 1238 shows grating 1237 on a first surface 1236 on the front side 1232 and a surface of the first side 1231.

Figure 13A:
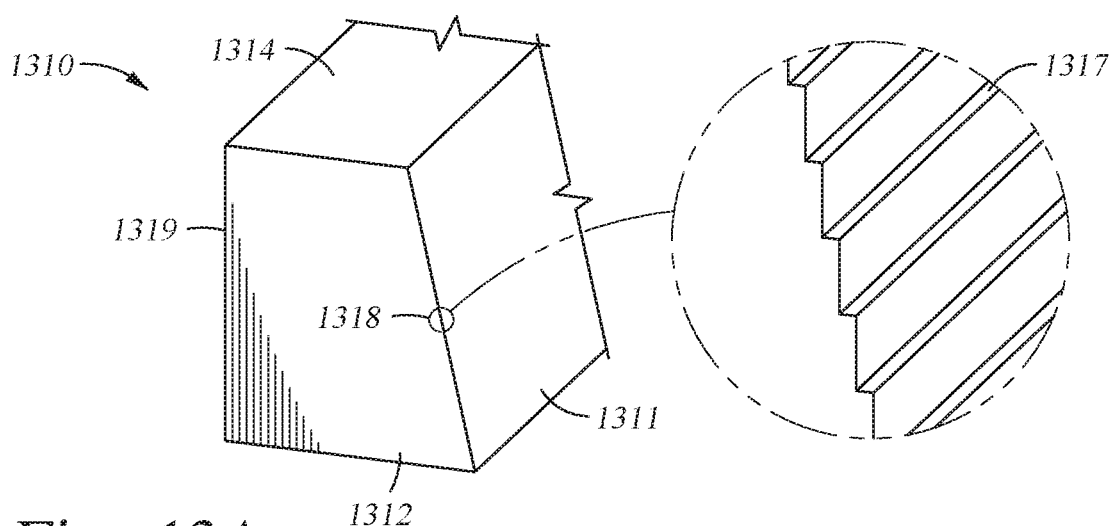
FIGS. 13A through 13C provides an illustration of a 3D optical structure having one or more stepped sides formed in the method of FIGS. 11A through 11E.
Figure 13B:
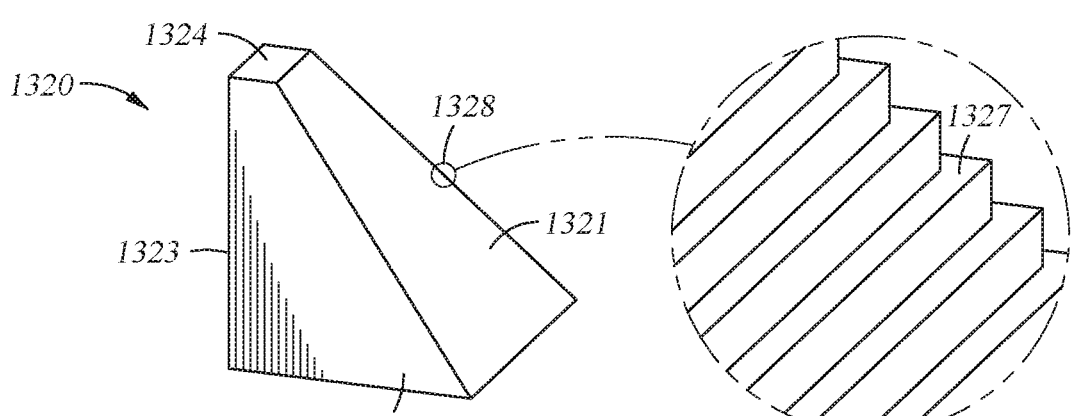
Figure 13C:
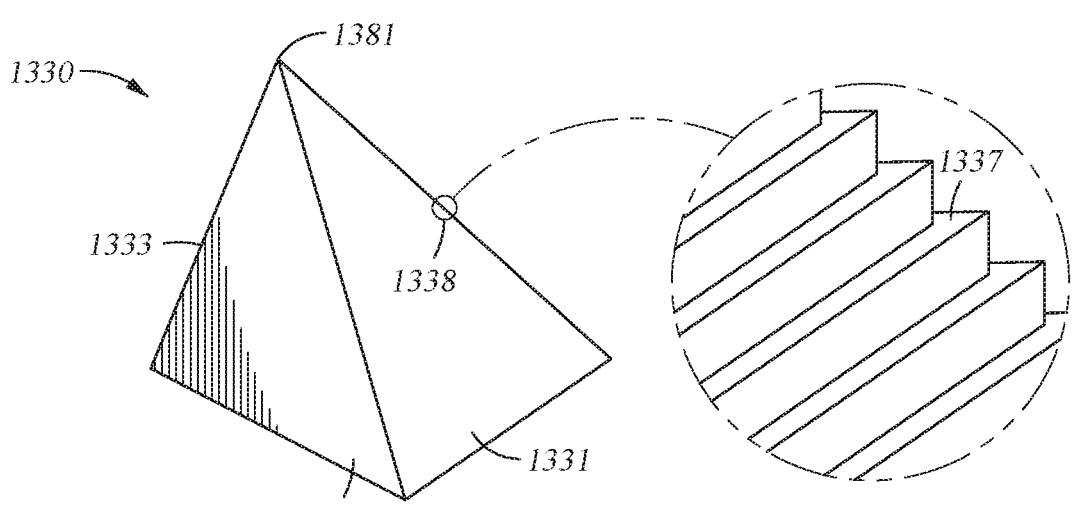

FIGS. 13A through 13C provides an illustration of a 3D optical structure having one or more stepped sides formed in the method of FIGS. 11A through 11E. For example, 3D optical structure may have only one side with the steps. Alternately, the 3D optical structure may have two or even three sides with the steps. The 3D optical structure represents one or more of the optical structures which may be formed on a meta surface. The sides of the 3D optical structure absent the steps may be essentially flat and vertical. Although only three shapes are illustrated in FIGS. 3A through 3C, it should be appreciated that the shape of the 3D structure may be polygonal having any number of sides.

FIG. 13A illustrates a trapezoidal prism 1310 having at least one substantially flat side. The trapezoidal prism 1310 is a three dimensional solid that has two congruent trapezoids for its front side 1312 and a far side (not shown). The trapezoidal prism 1310 has a top 1314, a bottom (not shown), a first side 1311 and a second side 1319, each rectangular in shape and connecting the corresponding sides of the front side 1312 and the far side. One or more of the first side 1311, the second side 1319, the front side 1312 and the far side may be angled from the bottom to the top 1314 such that the plan area of the bottom is larger than the plan area of the top 1314. One, two or three of the first side 1311, the second side 1319, the front side 1312 and the far side may have grating corresponding to sub-micron steps in the formation thereof. Additionally, one, two or three of the first side 1311, the second side 1319, the front side 1312 and the far side may be substantially flat without grating, i.e., structures formed therein. For example, a callout 1318 shows grating 1317 thereon a first side 1311 while the front side 1312 and the second side 1319 are substantially vertical and without grating. The front side 1312 and second side 1319 may have been formed with a blocking material preventing etching and the formation of grating, i.e., the steps.

FIG. 13B illustrates a square frustum 1320 having at least one substantially flat side. The square frustum 1320 is a three dimensional solid that has four congruent trapezoids for its front side 1322, a far side (not visible), a first side 1321 and a second side 1323. The square frustum 1320 has substantially planar a top 1324 and a bottom (not visible) each connecting the corresponding sides of the front side 1322, the far side, the first side 1321 and the second side 1323. Each of the first side 1321, the second side 1323, the front side 1322 and the far side may be angled from the bottom to the top 1324 such that the plan area of the bottom is larger than the plan area of the top 1324. One, two or three of the first side 1321, the second side 1323, the front side 1322 and the far side may have grating corresponding to sub-micron steps in the formation thereof. Additionally, one, two or three of the first side 1321, the second side 1323, the front side 1322 and the far side may be substantially flat without grating, i.e., structures formed therein. For example, a callout portion 1328 shows grating 1327 thereon the first side and far side while the front side 1322 and the second side 1323 are substantially vertical and without grating. The front side 1322 and second side 1323 may have been formed with a blocking material preventing etching and the formation of grating, i.e., the steps.

FIG. 13C illustrates a triangular pyramid 1330 having at least one substantially flat side. The triangular pyramid 1330 is a three dimensional solid that has three congruent triangles for its front side 1332, a far side 1333, and a first side 1331. The triangular pyramid 1330 has an apex at a top 1381 and a substantially planar bottom (not visible) each connecting the corresponding sides of the front side 1332 the far side 1333, and the first side 1331. Each of the first side 1331, the far side 1333, and the front side 1332 may be angled from the bottom to the top 1334 forming the apex at the top 1334. One or two of the first side 1331, the far side 1333 and the front side 1332 may have grating corresponding to sub-micron steps in the formation thereof. Additionally, one or two of the first side 1331, the far side 1333 and the front side 1332 may be substantially flat without grating, i.e., structures formed therein. For example, a callout 1338 shows grating 1337 thereon the first side 1312 and the far side 1333 while the front side 1332 is substantially vertical and without grating. The front side 1332 may have been formed with a blocking material preventing etching and the formation of grating, i.e., the steps.

Figure 14:
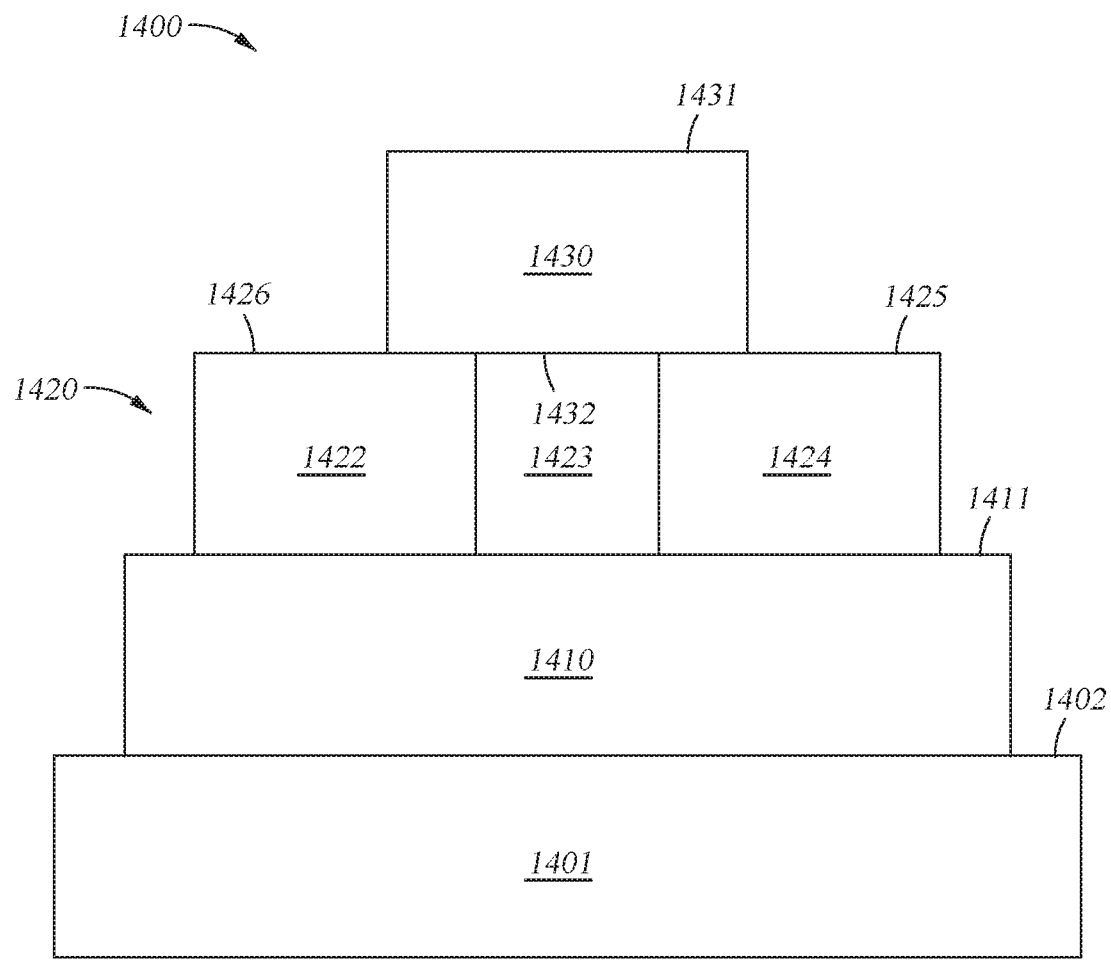
FIG. 14 illustrates another embodiment for the 3D optical material level structure formed on a diffractive optics element formed using the repetitive coating and exposure technique, the 3D optical material level structure having a gap therein.

FIG. 14 illustrates another embodiment for the 3D optical material level structure 1400 formed on a diffractive optics element formed using the repetitive coating and exposure technique, the 3D optical material level structure 1400 having a gap therein. The 3D functional optical material level structure 1400 may have a first level 1410 disposed on the substrate 1401. The first level 1410 may be patterned and exposed in a lithography operation. A plurality of second level features 1420 may be formed on a top surface 1411 of the first level feature 1410. For example, a resist material may be spun onto the first level features 1410. The second level features 1420 may be exposed in a lithography operation to form a first exposed portion 1422, a non-exposed resist portion 1423 and a second exposed portion 1422. A third level 1430 may be spun on top the second level features 1420. The third level features may be patterned and exposed to form exposed features 1431 therein. The 3D functional optical material level structure 1400 may then be developed to remove all resist that was not patterned and exposed in the lithography operation, for example, non-exposed resist portion 1423. The resultant structure may generate features of varying width and void therebetween. For example, a void (no material) now exists where non-exposed resist portion 1423 and the third level feature 1431 is disposed on top, or suspended, by a first upper surface 1426 of the first exposed portion 1422 and a second upper surface 1425 of the second exposed portion 1422. The development process produces a coherent mass of material and although discussion here was done with levels of materials, the individual levels are not present in the final 3D functional optical material level structure 1408. Furthermore, it should be appreciated that the size (width, length and height) of each portion forming the final 3D functional optical material level structure 1400 is fully customizable and merely a function of the thickness of material spun on to a lower level and the feature size in the pattern used in one or more lithography operations. Thus, fully customizable 3D functional optical material level structure 1400 can be formed on a diffractive optics element at a sub-micron scale.

Figure 15A:
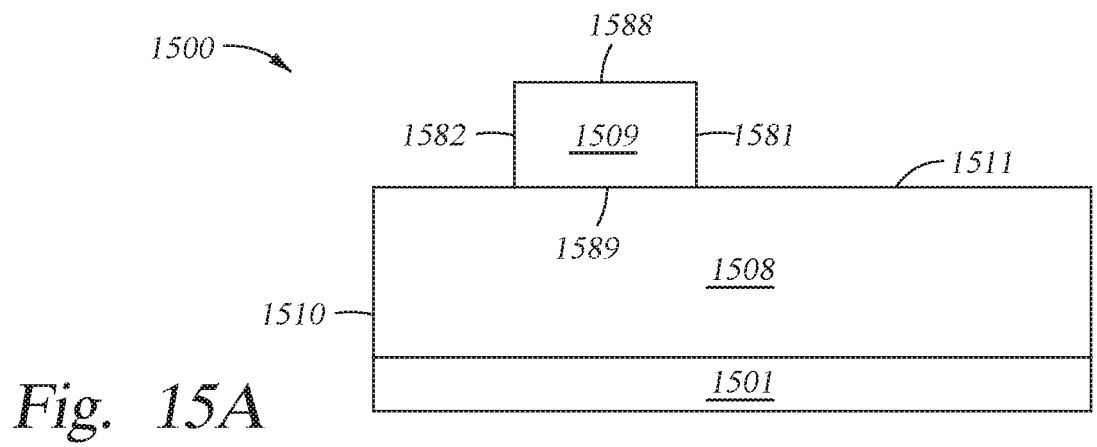
FIGS. 15A through 15I illustrates a method for building fully customizable 3D functional optical material level structure on a substrate using trim etch technique.

FIG. 15A through 15I illustrates a method for building fully customizable 3D functional optical material level structure 1500 on a substrate 1501 using the trim etch technique discussed above. The method starts at block 1510, as shown in FIG. 15A, wherein an optical material stack, i.e., film stack 1508, to be patterned into a diffractive optics element is deposited on a substrate 1501. The substrate 1501 may be a single optical material or diffractive optics element. The depositing material may be used to make a master for forming a 3D optical structure wherein the master is transposed from the final 3D optical structure. The film stack 1508 may be a resist material for forming features in the substrate below or the film stack 1508 may be a plurality of optical materials suitable to form the 3D functional optical material level structure 1500.

Block 1510 additionally includes a mask material 1509 is deposited and patterned on a top surface 1511 of the film stack 1508. The mask material 1509 has an upper surface 1588, a bottom surface 1589, a right side surface 1581 and a left side surface 1582. It should be appreciated that the mask material 1509 may be any shape having any number of sides surfaces and the following operations may be performed on one or more of the individual side surfaces. For simplicity, the following discussion will be with respect to the right side surface 1581 and the left side surface 1582. Additionally, the discussion shall utilize a right side 1591 and a left side 1592 of the 3D functional optical material level structure 1500. The mask material 1509 may be a photo resist or other suitable mask material. The formation of the mask material 1509 may be performed in a series of steps which deposit, expose, and remove unwanted mask material 1509.

Figure 15B:
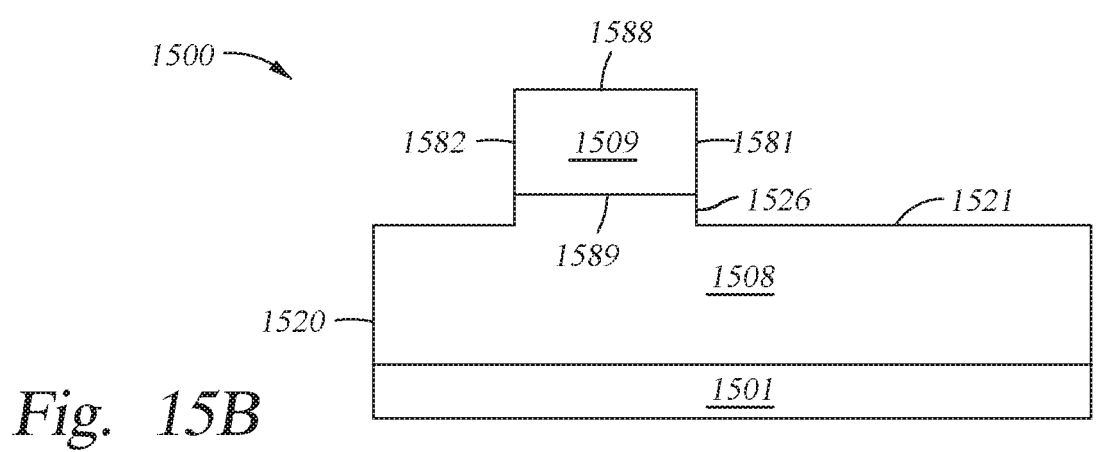

At block 1520, shown in FIG. 15B, the film stack 1508 is etched down one level. It should be appreciated that the layer, and each layer subsequently described with respect to the method described above, may have a thickness, or height, of between about 20 nm to about 1 micron, such as about 200 nm. The mask material 1509 prevents a first layer portion 1526 of the film stack 1508 from being etched. The top surface 1511 of the film stack 1508 is preserved under the mask material 1509 while other areas of the film stack 1508 is etched down to expose a new, i.e., second top surface 1521 one layer down.

Figure 15C:
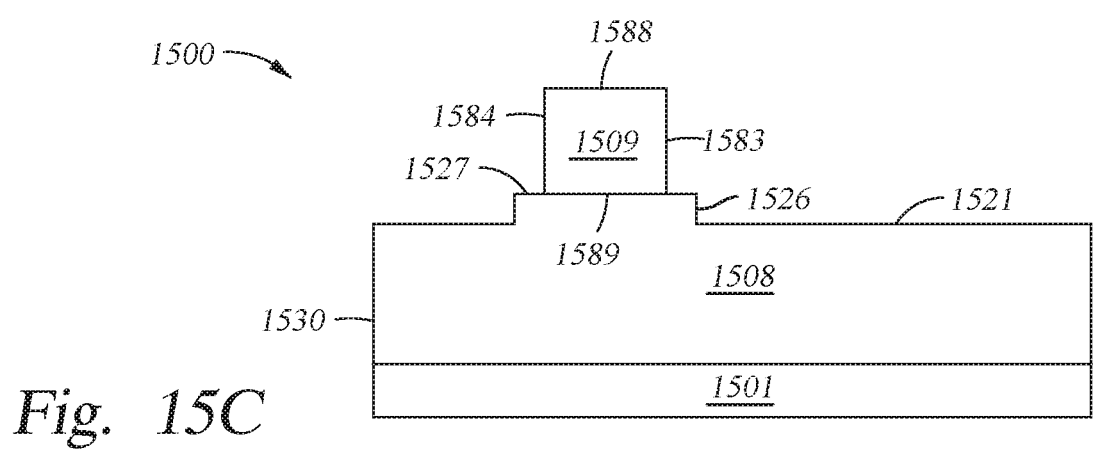

At block 1530, shown in FIG. 15C, the right side surface 1581 and the left side surface 1582 of the mask material 1509 is trimmed, i.e., etched laterally, by a desired distance. The desired distance for the trim may correspond to a lateral step size, for example, a first layer top portion 1527. The right side surface 1581 and the left side surface 1582 are trimmed away to reveal a plurality of new, i.e., a second left sides 1584 and a second right side 1583. The trimming of the mask material 1509 makes the width thereof smaller, i.e., the distance between the right side surface 1581 and the left side surface 1582 is greater than the distance between the second right side surface 1583 and the second left side surface 1584 of the mask material 1509 prior to trimming. The second right side surface 1583 and the second left side surface 1584 expose a first layer top portion 1527 which is no longer covered by the mask material 1509. The mask material 1509 may be trimmed along each of the sides between about 20 nm to about 1 micron, such as about 200 nm. Thus making the first layer top portion 1527 between about 20 nm to about 1 micron from a respective side of the mask material 1509. Alternately, the mask material 1509 is selectively trimmed etched, for example by directional etching.

Figure 15D:
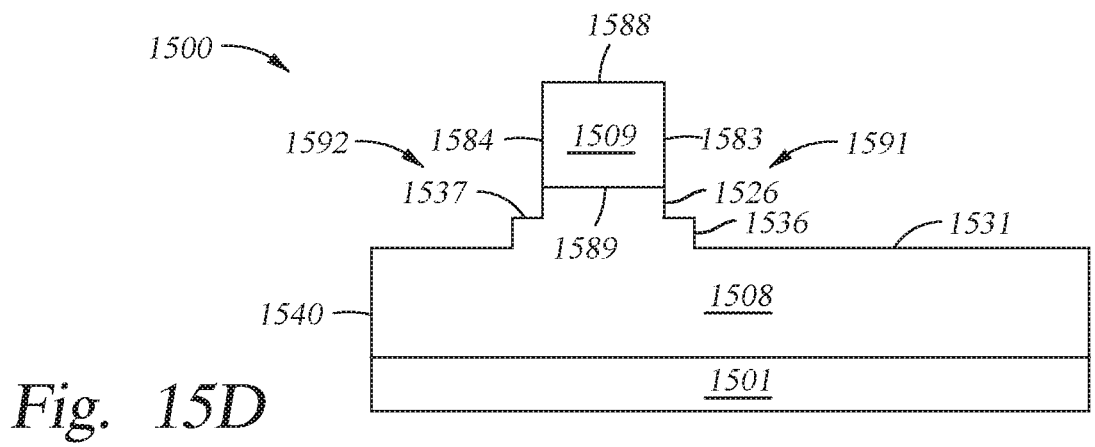
Figure 15E:
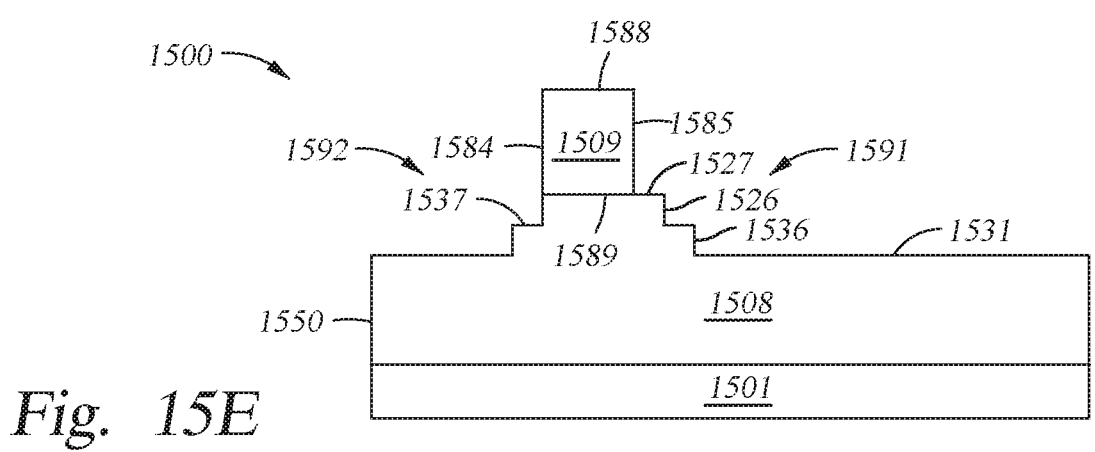

At block 1540, shown in FIG. 15D, a second vertical etch is performed on the optical material, i.e., film stack 1508, vertically down a $2^{nd}$ level. The film stack 1508 is etched one layer further down to expose a second layer portion 1536 and a second layer top portion 1537 while etching through the first layer top portion 1527. The mask material 1509 prevents the film stack 1508 directly thereunder, i.e., the first layer portion 1526 covered by the mask material 1509 and the second layer portion 1536 covered by the first layer portion 1526, from being etched. The top surface 1511 of the film stack 1508 is preserved under the mask material 1509 while other areas of the film stack 1508 is etched down to expose a new, i.e., third top surface 1531, the second layer top portion 1537, and the second layer portion 1536.

The sequence of steps above may be repeated any number of times to produce the desired structure. For example, the trim operation at block 1530 and etch operation at block 1540 are repeated 'N' times to form the desired stair-step structure having optional flat sections disposed throughout the structure. N is an integer corresponding to the number of levels for the sub-micron 3D optical structure. For example, the sub-micron 3D optical structure may have N equal to the number of levels for the sub-micron 3D optical structure. The sub-micron 3D optical structure may have 4, 8, 16 32 or more levels.

In one purely illustrative example, N is equal to 3 corresponding to 3 levels of etch and trim. At block 1550, shown in FIG. 15E, a third trim etching is performed to form a desired third lateral step size. The third trim operation may be a directional etch operation targeting one or more particular sides of the mask material 1509. For example, the directional etch may trim the second right side 1583 to reveal a third right side 1585 while leaving second left sides 1584 intact. The trim operation may reveal the first layer top portion 1527 yet again on the right side 1591 while leaving the mask material 1509 covering the first layer 1526 on the left side 1592.

Figure 15F:
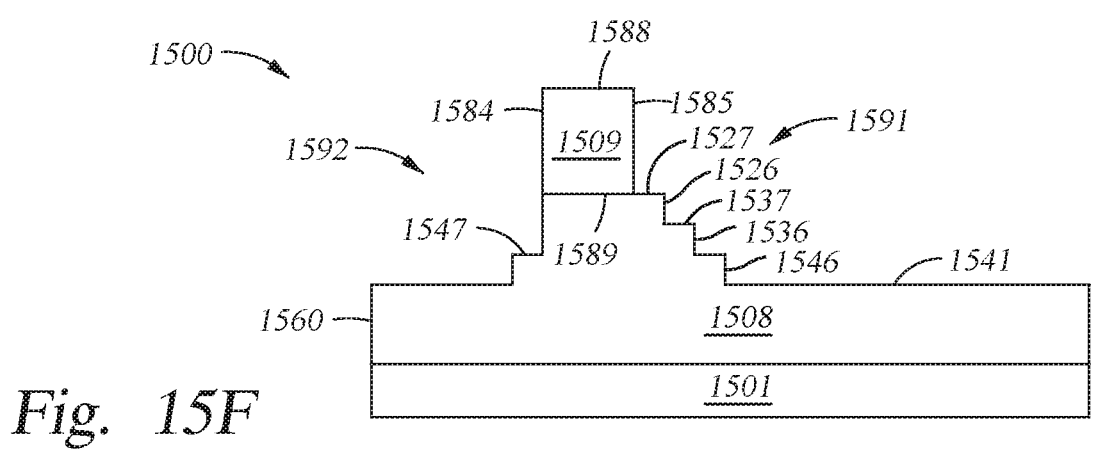

At block 1560 shown in FIG. 15F, the film stack 1508 is etched further one layer down to expose a third layer portion 1546. The mask material 1509 prevents the film stack 1508 directly thereunder from being etched. The top surface 1511 of the film stack 1508 is preserved under the mask material 1509 while areas of the film stack 1508 is etched down to expose a new, i.e., fourth top surface 1541 and a third layer top portion 1547 of the third layer portion 1546. The left side 1592 is substantially vertical up from the third top layer portion 1547 while the rights side 1591 has a series of steps corresponding to the third layer portion 1546, the second layer portion 1536 and the first layer portion 1526.

Figure 15G:
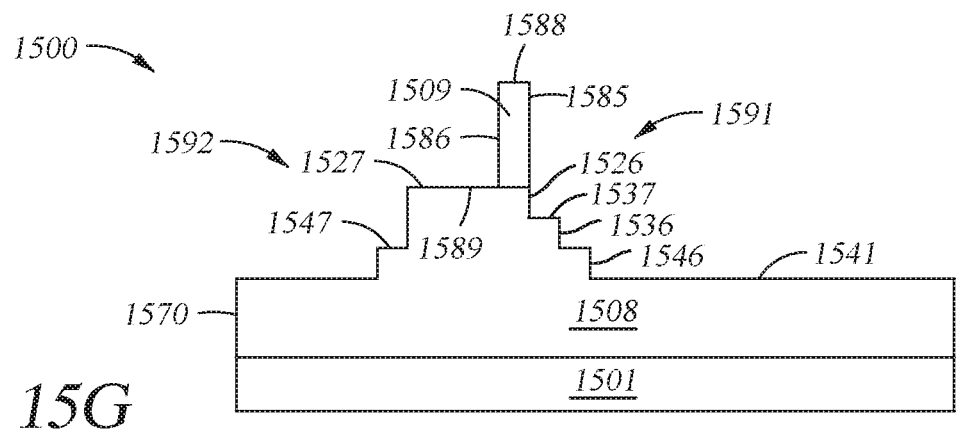

At block 1570 shown in FIG. 15G, a fourth trim operation is performed to form a desired fourth lateral step size. The second trim operation is a directional etch operation targeting the second left side 1584. The second left side 1584 of the mask material 1509 is trimmed to a new third left side 1586 while leaving the third right side 1585 intact. The trim operation may reveal the first layer top portion 1527 yet again on the right side 1591 while leaving the mask material 1509 covering the first layer 1526 on the left side 1592.

Figure 15H:
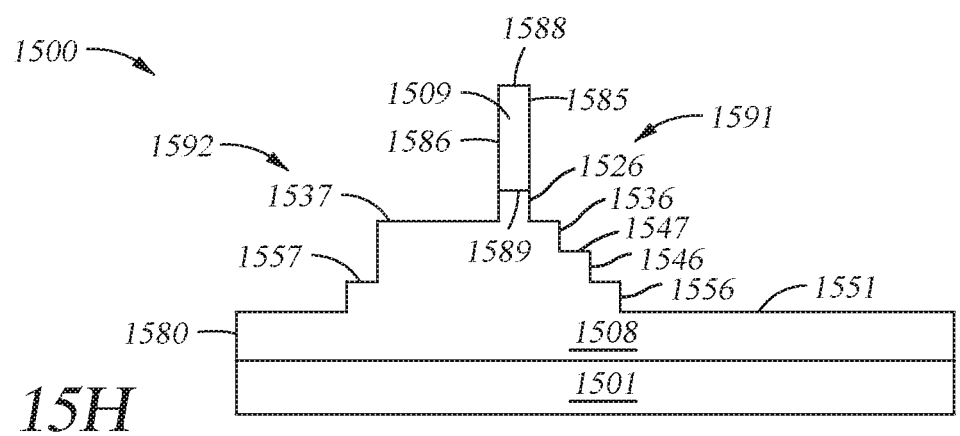

At block 1580 shown in FIG. 15H, the film stack 1508 is etched further one layer down to expose a fourth layer portion 1556. The mask material 1509 prevents the film stack 1508 directly thereunder from being etched. The top surface 1511 of the film stack 1508 is preserved under the mask material 1509 while areas of the film stack 1508 is etched down to expose a new fifth top surface 1551 and a fourth layer top portion 1557 of the fourth layer portion 1556. The left side 1592 now has a single step from the second top layer portion 1537 while the right side 1591 has a series of steps corresponding to the fourth layer portion 1556, the third layer portion 1546, the second layer portion 1536 and the first layer portion 1526.

Figure 15I:
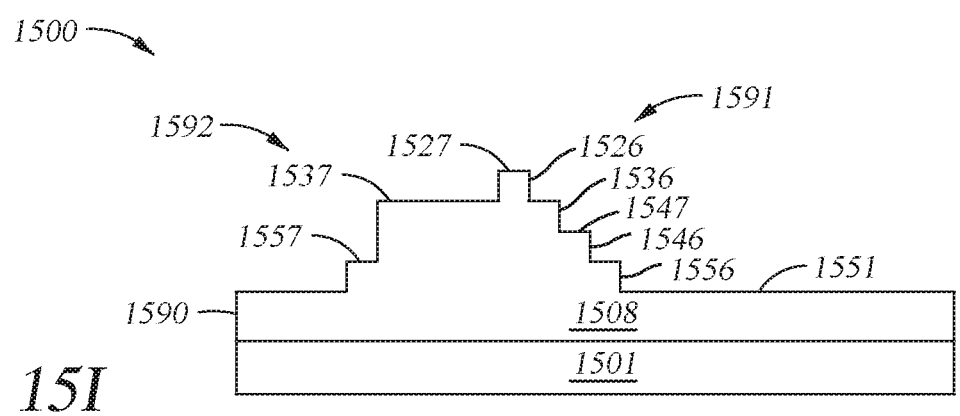

At block 1590 shown in FIG. 15I, the mask material 1509 is stripped from the film stack 1508 to reveal the 3D optical structure 1500. A profile for the fourth layer portion 1556, the third layer portion 1546, the second layer portion 1536, and the first layer portion 1526 is asymmetric about a center of the 3D optical structure 1500. It should be appreciated that the preceding steps of etching and trimming can be repeated any number of times to produce symmetrical 3D structures having a multitude of layers prior to stripping the mask material 1509 wherein each layer has a thickness, or height, of between about 20 nm to about 1 micron, such as about 200 nm. It should also be appreciated that the trimming of the sides for the mask material 1509 may optionally be skipped for one or more layers where a straight vertical wall is desired over a stepped wall.

Figure 16:
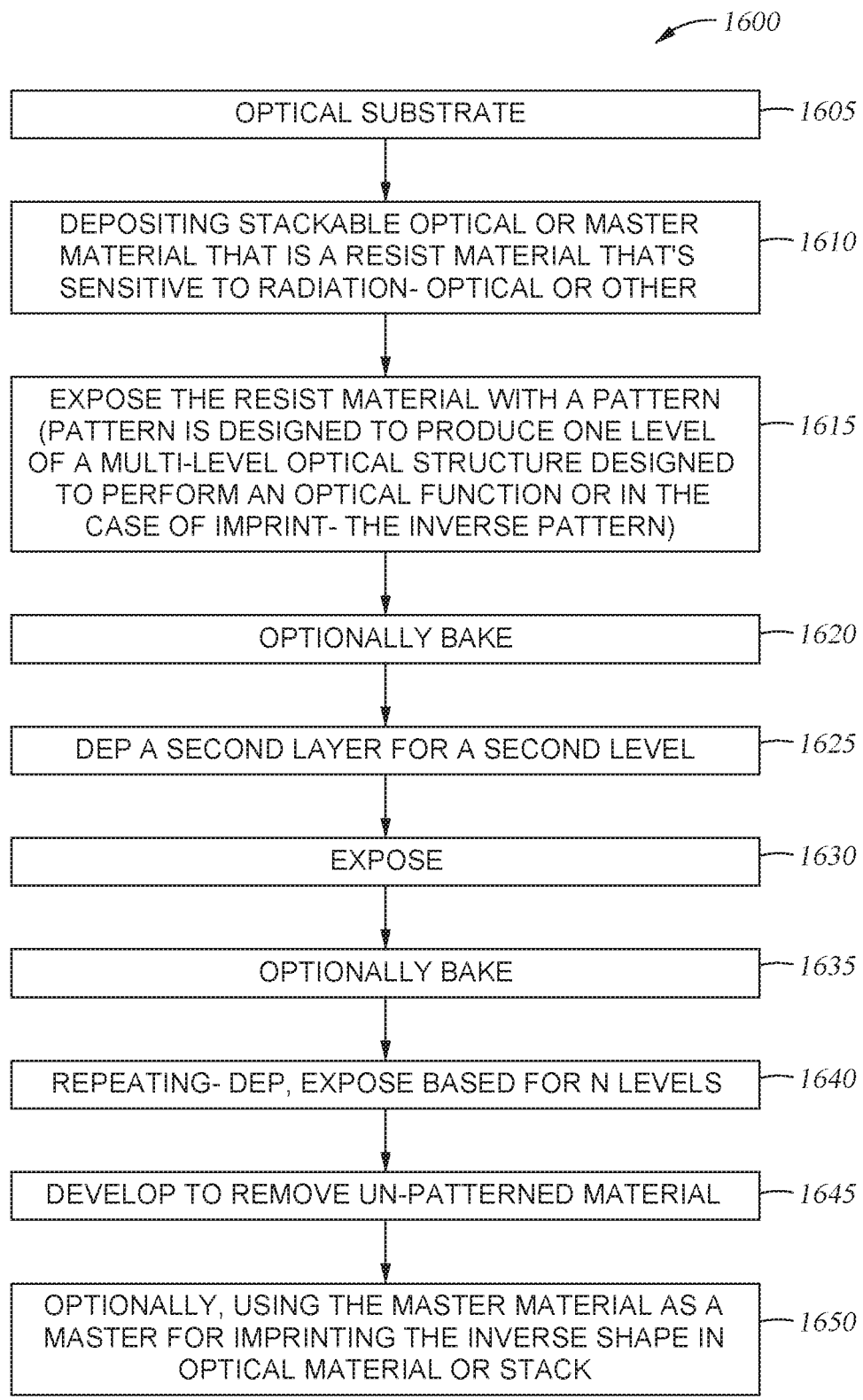
FIG. 16 shows a method for forming a sub-micron 3D optical material structure on a substrate using repetitive coating and exposure technique as shown in FIGS. 7A through 7J.

FIG. 16 and FIGS. 7A through 7J will now be discussed together. FIG. 16 shows method 1600 for forming a sub-micron 3D optical material structure on a substrate without planarization. FIGS. 7A through 7J may be used to illustrate the method 1600 of FIG. 16 for building 3D functional optical material level structure on a substrate using a second embodiment of the repetitive coating and exposure technique.

At block 1605 shown in FIG. 7A, an optical substrate prepared for building 3D functional optical material level structure on a substrate using a second embodiment of the repetitive coating and exposure technique. The substrate 701 may have a $SiO_2$ layer grown thereon, for example, formed by thermal oxide growth. The technique forces an oxidizing agent to diffuse into the substrate at high temperatures and react with it. The $SiO_2$ layer may be grown to about 100 nm.

At block 1610 shown in FIG. 7B, a stackable optical material 711, or master material, that is a resist material sensitive to optical or other radiation, is deposited on the substrate 701. The stackable optical material 711 may be deposited, spin coated or placed thereon the substrate 701 by any suitable technique. In one embodiment, the stackable optical material 711 is spin coated onto the substrate 701. The stackable optical material 711, and each layer described below with respect to FIGS. 7A through 7J, may have a thickness, or height, of between about 20 nm to about 1 micron, such as about 200 nm.

At block 1615 shown in FIG. 7C, the stackable optical material 711 is exposed to form a pattern therein. The pattern is designed to produce a first level of a multi-level optical structure designed, or in the case of imprint, provide an inverse pattern for a master to be used in the manufacture of multiple optical structures.

At block 1620 shown in FIG. 7C, the stackable optical material 711 is optionally baked. The exposure and baking process 719 results in the stackable optical material 711 forming a plurality of first cured materials 716 in the locations which were exposed through the mask and then baked.

At block 1625 shown in FIG. 7D, a second layer of optical material 721 is deposited on the stackable optical material 711, inclusive of the first cured materials 716. The second layer of optical material 721 may be spin coated onto the stackable optical material 711 or formed by other suitable techniques.

At block 1630 shown in FIG. 7E, the second layer of optical material 721 is exposed to form a pattern therein. The pattern is designed to produce the second level of the multi-level optical structure, or in the case of imprint, provide the second level in construction of the inverse pattern for the master to be used in the manufacture of multiple optical structures.

At block 1635 shown in FIG. 7E, the stackable optical material 711 is optionally baked. The exposure and baking process 719 results in the stackable optical material 711 forming a plurality of first cured materials 716 in the locations which were exposed through the mask and then baked.

At block 1640, the step 1625 for depositing optical material on an underlying layer, the step 1630 for exposing the optical material to form a pattern therein, and the step 1635 for optionally baking the patterned optical material are repeating for N levels to produce a multi-level 3D functional optical material level structure. The 3D functional optical material level structure has N levels such as 4 levels, 8 levels, 16 levels, 32 levels, or maybe more.

At block 1645, shown in FIG. 7J, the exposed and cured regions of the N patterns on N layers are simultaneously developed. The development removes the un-patterned material from the 3D functional optical material level structure, or master. The developed 3D structure, or master, is formed from the cured materials layers left behind on the substrate 701.

At block 1650, the master left behind from the development step above is used for imprinting the inverse shape in an optical material or stack. Thus, the optical material may be repeatedly and accurately used to form a plurality of 3D functional optical material level structures.

Advantageously, the methods described above provide techniques having reduced steps for building sub-micron devices. The techniques require fewer operations (such as planarization) saving raw materials, machine operational costs, and time. The 3D optical devices may be symmetrical or asymmetrical and are formed from units having dimensions between about 20 nm to about 1 micron, such as about 200 nm in each of the coordinate directions, such as in an X, Y and Z direction. The 3D optical devices therefore can be made small enough to be utilized for creating high resolution holographic images from small devices.

In addition to the examples described above, some additional non-limiting examples may be described as follows:

Example 1.1 A method for forming a sub-micron asymmetrical 3D optical material structure on a substrate without planarization, the method comprising:
  forming a plurality of first functional material levels on a top surface of a substrate at a depth of less than one micron;
  treating a first outer surface of the first functional material levels, the first outer surface having a first top surface;
  forming a plurality of second functional material levels on the first top surface for one or more of the first functional material levels only and at a depth of less than one micron;
  treating a second outer surface of the second functional material levels, the second outer surface having a second top surface; and
  forming a plurality of third functional material levels on the second top surface for one or more of the second functional material levels only and at a depth of less than one micron.

Example 1.2 The method of example 1.1 wherein forming the first functional material level may not have a second third functional material level formed thereon.

Example 1.3 The method of example 1.2 wherein the first, second and third functional material levels result in pillars of various heights on the substrate.

Example 1.4 The method of example 1.2 wherein the second third functional material level and the third functional material are not formed directly on the top surface of the substrate.

Example 1.5 The method of example 1.1 wherein the depth for each of the first, second and third functional material levels is about 200 nm.

Example 1.6 The method of example 1.1 wherein treating the first and second functional material levels further comprises at least one of:
  forming an atomic deposition layer;
  doping or ion implantation; and
  radiation hardening.

Example 1.7 The method of example 1.6 wherein treating the first and second functional material level changes the composition of the first outer surface and the second outer surface respectively such that a solvent or other chemical of a functional material level overlaid thereon will not attack the first and second functional material level.

Example 1.8 The method of example 1.1 further comprising:
  imprinting the inverse shape of the sub-micron asymmetrical 3D optical material structure in an optical material or stack.

Example 2.1 A method for forming a sub-micron asymmetrical 3D optical material structure on a substrate without planarization, the method comprising:
  forming a first functional material level on a top surface of a substrate at a depth of less than one micron;
  impregnating the first functional material level to form a first treated functional material level, the first treated functional material level having a first top surface;
  forming a second functional material level on the first top surface for one or more of the first treated functional material level only and at a depth of less than one micron;
  impregnating the second functional material level to form a second treated functional material level, the second treated functional material level having a second top surface; and
  forming a third functional material level on the second top surface for one or more of the second treated functional material level only and at a depth of less than one micron.

Example 2.2 The method of example 2.1 wherein the first functional material level may not have a second third functional material level formed thereon.

Example 2.3 The method of example 2.2 wherein forming the first, second and third functional material levels result in pillars of various heights on the substrate.

Example 2.4 The method of example 2.2 wherein the second third functional material level and the third functional material are not formed directly on the top surface of the substrate.

Example 2.5 The method of example 2.1 wherein impregnating the first and second functional material levels further comprises:
  baking or electron volt implantation to alter the structure of the first, second and third functional material levels.

Example 2.6 The method of example 2.5 wherein impregnating the first and second functional material levels treatment alters the structure of the first and second functional material levels to a more robust material substantially chemically inert to a subsequent layer which may be disposed thereon.

Example 2.7 The method of example 2.1 further comprising:
  imprinting the inverse shape of the sub-micron asymmetrical 3D optical material structure in an optical material or stack.

Example 3.1 A method for forming a sub-micron asymmetrical 3D optical material structure on a substrate without planarization, the method comprising:
  forming a first functional material level on a top surface of a substrate at a depth of less than one micron, the first functional material level having a first top surface and being of a first material;
  forming a second functional material level on the first top surface of the first functional material level at a depth of less than one micron, the second functional material level having a second top surface and being of a second material compatible for stacking on the first material; and
  forming a third functional material level on the second top surface of the second functional material level at a depth of less than one micron, the third functional material level being of the first material compatible for stacking on the second material.

Example 3.2 The method of example 3.1 wherein the first functional material level may not have a second third functional material level formed thereon.

Example 3.3 The method of example 3.2 wherein forming the first, second and third functional material levels result in pillars of various heights on the substrate.

Example 3.4 The method of example 3.2 wherein the second third functional material level and the third functional material are not formed directly on the top surface of the substrate.

Example 3.5 The method of example 3.1 wherein the first functional material level may be a sol-gel base material and the first functional material level may be a polymer based material.

Example 3.6 The method of example 3.5 wherein the third functional material is of a sol-gel base material.

Example 3.7 The method of example 3.1 wherein the first functional material, the second functional material and the third functional material have a height of between about 20 nm to about 1 micron.

Example 3.8 The method of example 3.7 wherein the height is about 200 nm.

Example 3.9 The method of example 3.1 further comprising:
imprinting the inverse shape of the sub-micron asymmetrical 3D optical material structure in an optical material or stack.

Example 4.1 A method for forming a sub-micron asymmetrical 3D optical material structure from sol-gel on a substrate without planarization, the method comprising:
forming a first functional material level on a top surface of a substrate at a depth of less than one micron, the first functional material level having a first top surface and being of a sol-gel material;
forming a second functional material level on the first top surface of the first functional material level at a depth of less than one micron, the second functional material level having a second top surface and being of the sol-gel material; and
forming a third functional material level on the second top surface of the second functional material level at a depth of less than one micron, the third functional material level being of the sol-gel material.

Example 4.2 The method of example 4.1 further comprising:
curing the sol-gel material of the first functional material level to form a compatible polymer that is robust enough to allow the colloidal solution of the second functional material level to be placed thereon.

Example 4.3 The method of example 4.2 wherein the compatible polymer is $SiO_x$.

Example 4.4 The method of example 4.1 wherein forming a first functional material level comprises:
depositing the sol-gel material by spin coating.

Example 4.4 The method of example 4.1 wherein the first functional material, the second functional material and the third functional material have a height of between about 20 nm to about 1 micron.

Example 4.5 The method of example 4.4 wherein the height is about 200 nm.

Example 4.6 The method of example 4.1 wherein the first functional material level may not have a second third functional material level formed thereon.

Example 4.7 The method of example 4.6 wherein forming the first, second and third functional material levels result in pillars of various heights on the substrate.

Example 4.8 The method of example 4.1 further comprising:
imprinting the inverse shape of the sub-micron asymmetrical 3D optical material structure in an optical material or stack.

Example 5.1 A method for forming a sub-micron symmetrical 3D optical material structure into a film stack disposed on a substrate without planarization, the method comprising:
forming a mask material on to a top surface of the film stack, the mask material having a plurality of sides;
etching the top surface of the film stack a depth of less than one micron revealing a second top surface and forming a first material level under the mask material;
trimming the sides of the mask material by less than one micron to reveal a second side surface of the mask material and a first upper surface of the first material level;
etching the second top surface of the film stack and the first upper surface of the first material level by a depth of less than one micron forming a second material level under the first material level and revealing a third top surface for the film stack and a second upper surface for the second material level;
trimming the second sides of the mask material by less than one micron to reveal a third side surface of the mask material and the first upper surface of the first material level;
etching the third top surface of the film stack, the first upper surface of the first material level and the second upper surface of the second material level all by a depth of less than one micron forming a third material level under the second material level and revealing a fourth top surface for the film stack and a third upper surface for the third material level; and
stripping the mask material from the film stack to reveal a step 3D optical material structure.

Example 5.2 The method of example 5.1 wherein the depth of the etch is about 200 nm.

Example 5.3 The method of example 5.1 wherein trimming the second sides of the mask material a desired distance corresponding to a lateral step size.

Example 5.4 The method of example 5.3 wherein the lateral step size is substantially similar to the depth.

Example 5.5 The method of example 5.3 further comprising:
directional etching the mask material.

Example 5.6 The method of example 5.1 wherein the second top surface is closer to the mask material than the third top surface.

Example 5.7 The method of example 5.1 further comprising:
depositing a blocking layer resistant to etch of the other materials; and
patterning the blocking layer with lithography.

Example 5.8 The method of example 5.7 wherein response to the patterning of the blocking material, the method further comprises:
developing the blocking layer and removing un-patterned material.

Example 5.9 The method of example 5.7 further comprising:
striping the blocking layer.

Example 5.10 The method of example 5.1 further comprising:
skipping the trimming of the sides of the mask material for one or more etching operations.

Example 5.11 The method of example 5.1 further comprising:
imprinting the inverse shape of the step 3D optical material structure in an optical material or stack.

Example 6.1 A method for forming a sub-micron one sided symmetrical 3D optical material structure into a film stack disposed on a substrate without planarization, the method comprising:

forming a hardmask on a top surface of the film stack;

forming a mask material on to a portion of the top surface of the film stack and a portion of the hardmask, the mask material having a plurality of sides;

etching the top surface of the film stack a depth of less than one micron revealing a second top surface and forming a first material level under the mask material;

trimming the sides of the mask material by less than one micron to reveal a second side surface of the mask material and a first upper surface of the first material level;

etching the second top surface of the film stack and the first upper surface of the first material level by a depth of less than one micron forming a second material level under the first material level and revealing a third top surface for the film stack and a second upper surface for the second material level;

trimming the second sides of the mask material by less than one micron to reveal a third side surface of the mask material and the first upper surface of the first material level;

etching the third top surface of the film stack, the first upper surface of the first material level and the second upper surface of the second material level all by a depth of less than one micron forming a third material level under the second material level and revealing a fourth top surface for the film stack and a third upper surface for the third material level; and stripping the mask material from the film stack to reveal the sub-micron symmetrical 3D optical material structure.

Example 6.2 The method of example 6.1 further comprising:

removing the hardmask;

forming a second mask material a step 3D optical material structure and the fourth top surface of the film stack;

etching the top surface of the film stack to the depth of the fourth top surface; and stripping the second mask material from the film stack to reveal a sub-micron one sided symmetrical 3D optical material structure.

Example 6.3 The method of example 6.1 further comprising:

imprinting the inverse shape of the one sided symmetrical 3D optical material structure in an optical material or stack.

Example 6.4 The method of example 6.1 wherein the depth of the etch is about 200 nm.

Example 6.5 The method of example 6.1 wherein trimming the second sides of the mask material a desired distance corresponding to a lateral step size.

Example 6.6 The method of example 6.5 wherein the lateral step size is substantially similar to the depth.

Example 6.7 The method of example 6.5 further comprising:

directional etching the mask material.

Example 6.8 The method of example 6.1 wherein the second top surface is closer to the mask material than the third top surface.

Example 6.9 The method of example 6.1 further comprising:

skipping the trimming of the sides of the mask material for one or more etching operations.

Example 6.10 The method of example 6.1 further comprising:

imprinting the inverse shape of the 3D optical material structure in an optical material or stack.

Example 7.1 A sub-micron 3D optical material structure on a diffractive optics element, the 3D optical material structure comprising:

a substrate having a top surface;

a first material level formed on the top surface of the substrate, wherein the first material level has a first top surface and comprises:

a plurality of first unit pieces of material, each first unit piece of material having a height, a width and a length, all of which are less than about one micron;

a second material level formed on the first top surface of the first material level, wherein the second material level has a second top surface and comprises:

a plurality of second unit pieces of material, wherein each second unit piece of material is disposed on one of the first unit pieces of material and each second unit piece of material having a second height, a second width and a second length, substantially similar to the height, the width and the length of the first unit piece of material; and a third material level formed on the second top surface of the second material level, wherein the third material level comprises:

a plurality of third unit piece of material, wherein each third unit piece of material is disposed on one of the second unit piece of material and each third unit piece of material having a third height, a third width and a third length, substantially similar to that of the second unit piece of material.

Example 7.2 The 3D optical material structure of example 7.1 wherein the first material level further comprises:

a plurality of first vias, wherein the first vias are devoid of any of the plurality of first unit pieces.

Example 7.3 The 3D optical material structure of example 7.2 wherein each via of the plurality of first vias is substantially similar in size to that of the first unit piece.

Example 7.4 The 3D optical material structure of example 7.2 wherein each second unit piece is disposed on a first unit piece and not on or in any of the plurality of first vias.

Example 7.5 The 3D optical material structure of example 7.2 wherein the second material level further comprises:

a plurality of second vias, wherein the second vias are devoid of any of the plurality of second unit pieces and disposed on the plurality of first vias.

Example 7.6 The 3D optical material structure of example 7.5 wherein one or more of the plurality of second vias is additionally disposed on one or more of the first unit pieces.

Example 7.7 The 3D optical material structure of example 7.6 wherein a multitude of layers are be stacked to form the 3D optical material structure having four (4), eight (8), sixteen (16), thirty two (32) or more layers of material.

Example 8.1 A sub-micron 3D optical material structure on a diffractive optics element, the 3D optical material structure comprising:

a substrate having a top surface;

a film stack disposed on the top surface of the substrate having an upper surface;

a first material level formed on the upper surface of the film stack having a first width and a first upper surface;

a second material level formed on the first upper surface of the first material level having a second width and a second upper surface; and a third material level formed on the second upper surface of the second material level having a third width wherein the first width is greater than the second width which is greater than the third width, and wherein the first width, the second width and the third width form a profile symmetric about a center of the 3D optical material structure.

Example 8.2 The 3D optical material structure of example 8.1 wherein a depth of the first material level, the second material level and the third material level is between about 20 nm to about 1 micron.

Example 8.3 The 3D optical material structure of example 8.1 wherein a depth of the first material level, the second material level and the third material level is about 200 nm.

Example 8.3 The 3D optical material structure of example 8.1 further comprising:
a void in the second material level having no material therein disposed on the first material level and where the third material level spans the void when disposed on top thereof.

Example 8.4 The 3D optical material structure of example 8.1 wherein a size of a width, length and height for each material level forming the 3D optical material structure is a function of the thickness of material spun on to the first, second and third material level and a feature size in the pattern used in one or more lithography operations.

Example 8.5 The 3D optical material structure of example 8.1 further comprising:
a blocking layer disposed on one or more of the first, second and third material level configured to prevent the formation of subsequent material levels above the blocking layer.

Example 9.1 A method of fabricating a sub-micron 3D optical diffractive optics element, the method comprising:
A) depositing an optical material stack to be patterned into a diffractive optics element on a substrate;
B) depositing and patterning a mask material on a portion of the material stack;
C) etching the material stack down one level;
D) directionally etch one or more side portions of the mask material laterally by a desired distance;
E) vertically etching the material stack down vertically a $2^{nd}$ level;
F) repeating D and E; and
G) stripping the mask material.

Example 9.2 The method of example 9.1 further comprising:
depositing a blocking layer that is resistant to etch of the other materials may and patterned with lithography to a blocked area; and
adding a mask material covering a selected stepped regions and etching down the originally blocked area to the to a lower step level.

While the foregoing is directed to embodiments of the present invention, other and further embodiments of the invention may be devised without departing from the basic scope thereof, the embodiments described in claim 16 as illustrated in FIG. 16, the scope thereof is determined by the claims that follow:

What is claimed is:

1. A method for forming a sub-micron 3D optical material structure on a diffractive optics element without planarization, the method comprising:
A) depositing a material stack to be patterned on a substrate;
B) depositing and patterning a mask material on a portion of the material stack;
C) etching the material stack down one level;
D) trimming a side portion of the mask material;
E) etching the material stack down one more level;
F) repeating D and E 'N' times;
G) stripping the mask material from the material stack; and
(H) skipping the trimming of one side of the mask material for one or more etching operations.

2. The method of claim 1 further comprising:
using the etched material stack as a master for imprinting an inverse shape of the etched material stack in an optical material or stack.

3. The method of claim 1, wherein a depth of the etch is about 200 nm.

4. The method of claim 1, wherein trimming a side portion of the mask material comprises:
directional etching the mask material.

5. The method of claim 1, wherein trimming a side portion of the mask material comprises:
trimming a desired distance corresponding to a lateral step size.

6. The method of claim 5, wherein the lateral step size is substantially similar to a depth of the etch.

7. A method for forming a sub-micron 3D optical material structure on a diffractive optics element without planarization, the method comprising:
A) depositing a material stack to be patterned on a substrate;
B) depositing and patterning a mask material on a portion of the material stack;
C) etching the material stack down one level;
D) trimming a side portion of the mask material;
E) etching the material stack down one more level;
F) repeating D and E 'N' times;
G) stripping the mask material from the material stack; and
(H) depositing and patterning with lithography a hard mask layer configured to resist an etch of the material stack.

8. The method of claim 7 wherein response to the patterning of the hard mask layer, the method further comprises:
developing the blocking layer and removing un-patterned material.

9. The method of claim 8 further comprising:
striping the hard mask layer.

10. A method for forming a sub-micron 3D optical material structure on a diffractive optics element without planarization, the method comprising:
A) coating a substrate with a first layer of a material;
B) exposing the material with a lithography technique to produce a first pattern;
C) curing the exposed material;
D) coating the substrate with a second layer of the material;
E) exposing the material with the lithography technique to produce a second pattern;
F) curing the exposed material;
G) repeating steps D through F 'N' times for 'N' layers of the material having 'N' patterns exposed therein; and
H) developing the exposed and cured regions of 'N' patterns on n layers simultaneously.

11. The method of claim 10 further comprising:
growing a $SiO_2$ layer thereon the substrate in preparation of the first layer.

12. The method of claim 10 wherein each of the 'N' layers have a thickness of between about 20 nm to about 1 micron.

13. The method of claim 10 wherein curing the exposed material comprises:
exposing and baking the exposed material.

14. The method of claim 10 wherein coating the substrate with a second layer of the material comprises:
applying the second layer to the first layer without planarization of the first layer.

15. The method of claim 10 further comprising:
using the sub-micron 3D optical material structure as a master for imprinting an inverse shape of the sub-micron 3D optical material structure in an optical material or stack.

16. The method of claim 10 wherein not all of the first cured material from first layer has a second cured material in the second layer formed thereon.

17. The method of claim 16 wherein the first cured material in the first layer may be substantially similar to that of the second cured material in the second layer.

18. A method of fabricating a sub-micron 3D diffractive optics element, the method comprising:
A) depositing an optical material stack to be patterned into a diffractive optics element on a substrate;
B) exposing the material with a photolithography technique to produce a first pattern;
C) curing the exposed material;
D) repeating steps A through C 'N' times for 'N' layers of the material having 'N' patterns exposed therein;
E) developing the exposed and cured regions of 'N' patterns on n layers simultaneously to form a master wherein the master is an inverse of the sub-micron 3D diffractive optics element; and
F) using the master to form a plurality of the sub-micron 3D diffractive optics element.

19. The method of claim 18 further comprising:
forcing an oxidizing agent to diffuse into the substrate at high temperatures and react with the substrate in preparation of depositing the optical material stack.

20. The method of claim 18 wherein exposed material has a thickness of between about 20 nm to about 1 micron.

21. The method of claim 18 further comprising:
simultaneously developing the exposed and cured regions of the N patterns on N layers.

* * * * *